(12) United States Patent
Tateyama et al.

(10) Patent No.: US 10,173,408 B2
(45) Date of Patent: Jan. 8, 2019

(54) METHOD FOR CREATING SEPARATION START PORTION FOR LAYERED BODIES, DEVICE FOR CREATING SEPARATION START PORTION, AND ELECTRONIC DEVICE MANUFACTURING METHOD

(71) Applicant: ASAHI GLASS COMPANY, LIMITED, Chiyoda-ku (JP)

(72) Inventors: Yuki Tateyama, Tokyo (JP); Yasunori Ito, Tokyo (JP); Hiroshi Utsugi, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/616,251

(22) Filed: Jun. 7, 2017

(65) Prior Publication Data

US 2017/0266947 A1 Sep. 21, 2017

Related U.S. Application Data

(63) Continuation of application No. PCT/JP2015/084272, filed on Dec. 7, 2015.

(30) Foreign Application Priority Data

Dec. 26, 2014 (JP) ................................ 2014-263880

(51) Int. Cl.
*B32B 38/10* (2006.01)
*B32B 43/00* (2006.01)
(Continued)

(52) U.S. Cl.
CPC .............. *B32B 43/006* (2013.01); *B32B 7/06* (2013.01); *G02F 1/1303* (2013.01);
(Continued)

(58) Field of Classification Search
CPC . B32B 38/10; B32B 43/006; Y10T 156/1184; Y10T 156/1961; Y10T 156/1967
(Continued)

(56) References Cited

U.S. PATENT DOCUMENTS 4,653,373 A * 3/1987 Gerber .................... B23P 15/40
30/350
5,301,429 A * 4/1994 Bundy ................... B44D 3/164
15/236.01
(Continued)

FOREIGN PATENT DOCUMENTS

CN  102171745 A  8/2011
JP  2001-89019  4/2001
(Continued)

OTHER PUBLICATIONS

International Search Report dated Mar. 1, 2016 in PCT/JP2015/084272, filed on Dec. 7, 2015(with English Translation).
(Continued)

*Primary Examiner* — Mark A Osele
*Assistant Examiner* — Nickolas R Harm
(74) *Attorney, Agent, or Firm* — Oblon, McClelland, Maier & Neustadt, L.L.P.

(57) ABSTRACT

In a peeling starting portion preparing method of a laminate, for the laminate including a first substrate and a second substrate peelably attached via an adsorption layer, a knife is inserted with a predetermined amount from an end surface of the laminate into an interface between the first substrate and the adsorption layer so as to prepare the peeling starting portion at the interface. The knife includes a main body portion, a cutting edge portion continuous with the main body portion and tapered in a side view, and a ridge line which is a boundary between the main body portion and the cutting edge portion, and at least a part of the adsorption layer is scraped off by a ridge line portion including the ridge line.

18 Claims, 18 Drawing Sheets

(51) Int. Cl.
  *B32B 7/06* (2006.01)
  *G09F 9/00* (2006.01)
  *G02F 1/13* (2006.01)
  *H01L 21/304* (2006.01)
  *G02F 1/1333* (2006.01)
  *G02F 1/136* (2006.01)

(52) U.S. Cl.
  CPC .............. *G02F 1/1333* (2013.01); *G09F 9/00* (2013.01); *H01L 21/304* (2013.01); *B32B 38/10* (2013.01); *B32B 2457/00* (2013.01); *G02F 2001/13613* (2013.01); *Y10T 156/1184* (2015.01); *Y10T 156/1961* (2015.01); *Y10T 156/1967* (2015.01)

(58) Field of Classification Search
  USPC ........................................ 156/717, 761, 762
  See application file for complete search history.

(56) References Cited

U.S. PATENT DOCUMENTS

| | | | | |
|---|---|---|---|---|
| 6,415,843 B1* | 7/2002 | De | ................... | H01L 21/68707 15/236.01 |
| 6,857,255 B1* | 2/2005 | Wilkey | ................ | A01D 34/13 56/296 |
| 8,769,827 B2* | 7/2014 | Powers | ................... | B25D 3/00 30/167 |
| 8,985,177 B2* | 3/2015 | Zhuang | ................. | B26B 27/00 156/703 |
| 2004/0166653 A1* | 8/2004 | Kerdiles | ................ | G01N 19/04 438/458 |
| 2008/0305721 A1* | 12/2008 | Ohashi | ................... | B24B 7/228 451/41 |
| 2009/0165277 A1* | 7/2009 | Zussy | ................. | B28D 5/0017 29/426.5 |
| 2009/0320299 A1* | 12/2009 | Kuhn | ....................... | B08B 1/00 30/169 |
| 2011/0198040 A1* | 8/2011 | Ebata | .................... | B65H 41/00 156/750 |
| 2013/0048224 A1* | 2/2013 | George | ............ | H01L 21/67282 156/752 |
| 2014/0130987 A1* | 5/2014 | Li | .......................... | B32B 38/10 156/761 |
| 2014/0150980 A1* | 6/2014 | Itou | ..................... | B32B 43/006 156/714 |
| 2014/0332166 A1* | 11/2014 | Honda | ............. | H01L 21/67092 156/708 |

FOREIGN PATENT DOCUMENTS

| | | |
|---|---|---|
| JP | 2001-335204 | 12/2001 |
| JP | 2009-46283 | 3/2009 |
| JP | 2009-78902 | 4/2009 |
| JP | 2013-147325 | 8/2013 |
| WO | WO 2010/090147 A1 | 8/2010 |

OTHER PUBLICATIONS

Written Opinion dated Mar. 1, 2016 in PCT/JP2015/084272, filed on Dec. 7, 2015.

* cited by examiner

METHOD FOR CREATING SEPARATION START PORTION FOR LAYERED BODIES, DEVICE FOR CREATING SEPARATION START PORTION, AND ELECTRONIC DEVICE MANUFACTURING METHOD

TECHNICAL FIELD

The present invention relates to a peeling starting portion preparing method of a laminate, a peeling starting portion preparing device, and an electronic device manufacturing method.

BACKGROUND ART

In accordance with a reduction of thickness and weight in electronic devices such as display panel, solar cell, thin-film secondary battery or the like, the reduction of sheet thickness of substrate (first substrate) such as glass sheet, resin sheet, metal sheet or the like used for these electronic devices is required.

However, when the thickness of the substrate is thin, since a handling property of the substrate deteriorates, it is difficult to form a functional layer (thin film transistor (TFT), color filter (CF)) for the electronic device on a surface of the substrate.

Therefore, a method is proposed in which a reinforcing plate (second substrate) is attached to the rear surface of the substrate to configure a laminate in which the substrate is reinforced with the reinforcing plate, and to form a functional layer on the surface of the substrate in the state of the laminate (refer to PTL 1). In this method, since the handling property of the substrate is improved, the functional layer can be favorably formed on the surface of the substrate. The reinforcing plate is peeled off from the substrate after the functional layer is formed.

As a reinforcing plate peeling method is performed by, for example, curving and deforming the reinforcing plate or the substrate, or both thereof in a direction to separate them from each other from one of the two corner portions located on a diagonal line of the rectangular laminate to the other thereof. Here, in order to smoothly perform peeling, a peeling starting portion is prepared at one corner portion of the laminate. The peeling starting portion is prepared by inserting a knife with a predetermined amount between the substrate and the reinforcing plate from the end surface of the laminate, and forming the peeling starting portion in a predetermined area of one corner portion as in PTL 1.

CITATION LIST

Patent Literature

PTL 1: International Publication No. WO 2010/090147

SUMMARY OF INVENTION

Technical Problem

However, after a knife is removed from between a substrate and a reinforcing plate, the reinforcing plate separated from the substrate is reattached to the substrate and a peeling starting portion cannot be prepared in some cases.

It is conceivable to leave the knife between the substrate and the reinforcing plate to hold the peeling starting portion, and peel the substrate from the reinforcing plate in this state. However, in a peeling method in which the knife is left, since an unintended force is applied from the knife to the substrate during a peeling step (refer to PTL 1) in which an entire surface of the substrate is adsorbed and held by a plurality of adsorption pads, there is a possibility that the substrate is damaged.

In addition, in order to reliably perform adsorbing and holding of the substrate by the adsorption pad, the adsorption pad is pressed against the substrate. Due to the pressing force, the reinforcing plate peeled by the knife is reattached to the substrate in some cases.

The present invention has been made in view of the above problems, and an object thereof is to provide a peeling starting portion preparing method of a laminate, which can suppress reattachment of a first substrate and a second substrate even when a knife is removed from between the first substrate and the second substrate, and which can reliably prepare the peeling starting portion, a peeling starting portion preparing device, and an electronic device manufacturing method.

Solution to Problem

An aspect of the peeling starting portion preparing method of a laminate according to a the present invention is a peeling starting portion preparing method of a laminate, in which, for the laminate including a first substrate and a second substrate peelably attached via an adsorption layer, a knife is inserted with a predetermined amount from an end surface of the laminate into an interface between the first substrate and the adsorption layer so as to prepare the peeling starting portion at the interface, in which the knife includes a main body portion, a cutting edge portion continuous with the main body portion and tapered in a side view, and a ridge line which is a boundary between the main body portion and the cutting edge portion, and in which at least a part of the adsorption layer is scraped off by a ridge line portion including the ridge line.

An aspect of the peeling starting portion preparing device according to the present invention is a peeling starting portion preparing device, including a laminate holding means for holding a laminate including a first substrate and a second substrate peelably attached via an adsorption layer, a knife holding means for holding the knife, and a moving means for relatively moving the laminate holding means and the knife holding means to thereby insert the knife with a predetermined amount from an end surface of the laminate into an interface between the first substrate and the adsorption layer, in which the knife includes a main body portion, a tapered cutting edge portion continuous with the main body portion and a ridge line which is a boundary between the main body portion and the cutting edge portion, and a ridge line portion including the ridge line has a shape which is capable of scraping off at least a part of the adsorption layer.

An aspect of the electronic device manufacturing method according to the present invention is an electronic device manufacturing method, including, in a laminate including a first substrate and a second substrate peelably attached via an adsorption layer, a functional layer forming step of forming a functional layer on a surface of the first substrate and a peeling step of peeling the first substrate, on which the functional layer has been formed, from the second substrate, in which the peeling step includes a peeling starting portion preparing step of inserting a knife with a predetermined amount from an end surface of the laminate at an interface between the first substrate and the adsorption layer to prepare a peeling starting portion at the interface, and a peeling step of peeling the interface from the peeling starting portion as a starting point, and in which the knife includes a main body portion, a cutting edge portion continuous with the main body portion and tapered in a side view, and a ridge line which is a boundary between the main body portion and the cutting edge portion, and at least a part of the adsorption layer is scraped off by a ridge line portion including the ridge line.

According to an aspect of the present invention, it is preferable that the ridge line portion has a shape having a plurality of through holes at positions crossing the ridge line.

According to an aspect of the present invention, it is preferable that at least one of the plurality of through holes is a through hole having a burr.

According to an aspect of the present invention, it is preferable that at least two of the plurality of through holes are through holes each having a burr, and two of the burrs have projecting directions opposite to each other.

According to an aspect of the present invention, it is preferable that the ridge line portion has a shape having a corrugated ridge line in which crest portions and valley portions are alternately disposed when viewed from the cutting edge of the knife.

According to an aspect of the present invention, it is preferable that the ridge line portion has a shape in which particles are disposed.

Advantageous Effects of Invention

According to the peeling starting portion preparing method of the laminate, the peeling starting portion preparing device, and the electronic device manufacturing method of the present invention, a reattachment of a first substrate and a second substrate can be suppressed even when a knife is removed from between the first substrate and the second substrate, and the peeling starting portion can be reliably prepared.

DESCRIPTION OF EMBODIMENTS

Figure 1:
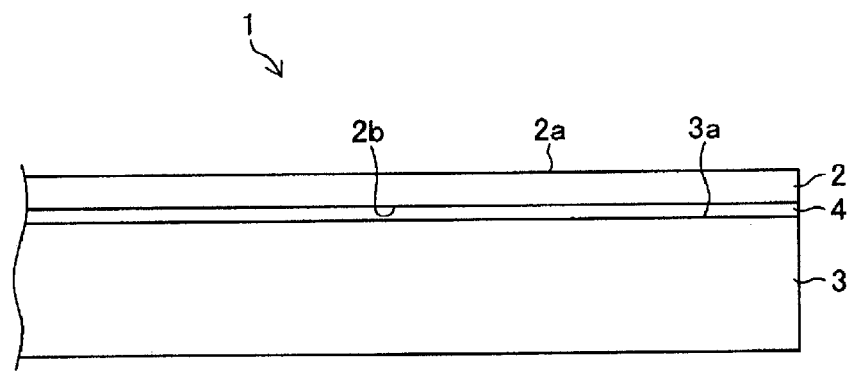
FIG. 1 is an enlarged side view of a main part illustrating an example of a laminate to be provided for a step for manufacturing an electronic device.

Hereinafter, preferred embodiments of the present invention will be described with reference to the accompanying drawings. The present invention is described by the following preferred embodiments. Modifications can be made by a number of methods without departing from the scope of the present invention, and other embodiments in addition to the following embodiments can be used. Accordingly, all modifications within the scope of the present invention are included in the scope of the claims.

Here, a portion indicated by the same symbol in the drawings is a similar element having a similar function. In addition, in this specification, in a case where a numerical range is indicated by using "~", the numerical range includes values of an upper limit and a lower limit indicated by "~".

Hereinafter, a case where a peeling starting portion preparing method of a laminate and a peeling starting portion preparing device according to the present invention are used in a step for manufacturing an electronic device will be described.

The electronic device is an electronic component such as a display panel, a solar cell, a thin film secondary battery, or the like. Examples of the display panel include a liquid crystal display (LCD) panel, a plasma display panel (PDP), and an organic electro luminescence (EL) display (OELD) panel.

[Step for Manufacturing Electronic Device]

The electronic device is manufactured by forming a functional layer (thin film transistor (TFT) and color filter (CF) in a case of LCD) for the electronic device on a surface of a substrate made of glass, resin, metal or the like.

Before the functional layer is formed, a rear surface of the substrate is attached to a reinforcing plate to be configured in a laminate. Thereafter, the functional layer is formed on the surface of the substrate in the state of the laminate. After the functional layer is formed, the reinforcing plate is peeled from the substrate.

That is, the step for manufacturing the electronic device is provided with a functional layer forming step of forming the functional layer on the surface of the substrate in a state of the laminate, and a peeling step of peeling the reinforcing plate from the substrate in which the functional layer has been formed. In the peeling step, the peeling starting portion preparing method of the laminate and the peeling starting portion preparing device according to the present invention are applied.

[Laminate]

FIG. 1 is an enlarged side view of a main part illustrating an example of a laminate 1.

The laminate 1 is provided with a substrate 2 as a first substrate on which a functional layer is formed, and a reinforcing plate 3 as a second substrate for reinforcing the substrate 2. In addition, the reinforcing plate 3 is provided with a resin layer 4 as an adsorption layer on a front surface 3a, and a rear surface 2b of the substrate 2 is attached to the resin layer 4. The substrate 2 is peelably attached to the reinforcing plate 3 via the resin layer 4 by an adhesive force of the resin layer 4 or Van der Waals force acting between the resin layer 4.

[Substrate]

As to the substrate 2 serving as the first substrate, a functional layer is formed on a front surface 2a thereof. Examples of the substrate 2 can include a glass substrate, a ceramic substrate, a resin substrate, a metal substrate, and a semiconductor substrate. Among these exemplified substrates, since the glass substrate is excellent in chemical resistance and moisture permeation resistance and has a small linear expansion coefficient, it is preferable as the substrate 2 for the electronic device. In addition, as the linear expansion coefficient decreases, the glass substrate has an advantage that the pattern of the functional layer formed under high temperatures becomes hard to be shifted during cooling.

Examples of glass of the glass substrate can include oxide based glass mainly containing silicon oxide, such as alkali free glass, borosilicate glass, soda lime glass, high silica glass, and the like. As the oxide based glass, a glass having a silicon oxide content of 40% to 90% by mass based on oxide conversion is preferable.

As the glass of the glass substrate, it is preferable to select and adopt glass suitable for the type of electronic device to be manufactured and glass suitable for the manufacturing process thereof. For example, it is preferable to adopt glass (alkali-free glass) substantially free of alkali metal components on the glass substrate for the liquid crystal panel.

The thickness of the substrate 2 is set based on the type of the substrate 2. For example, in a case where a glass substrate is adopted for the substrate 2, in order to reduce the weight and sheet thickness of the electronic device, the thickness thereof is preferably set to 0.7 mm or less, more preferably 0.3 mm or less, and further preferably 0.1 mm or less. In a case where the thickness is 0.3 mm or less, good flexibility can be provided to the glass substrate. Furthermore, in a case where the thickness is 0.1 mm or less, the glass substrate can be wound into a roll shape. From a viewpoint of manufacturing the glass substrate and viewpoint of handling of the glass substrate, the thickness thereof is preferably 0.03 mm or more.

Although the substrate 2 is configured to include one sheet of substrate in FIG. 1, the substrate 2 may be configured to include a plurality of sheets of substrate. That is, the substrate 2 can be configured to include the laminate in which the plurality of sheets of the substrate are laminated.

[Reinforcing Plate]

Examples of the reinforcing plate 3 serving as the second substrate include a glass substrate, a ceramic substrate, a resin substrate, a metal substrate, and a semiconductor substrate.

The type of the reinforcing plate 3 is selected based on the type of the electronic device to be manufactured, the type of the substrate 2 used for the electronic device, and the like. If the reinforcing plate 3 and the substrate 2 have the same material, it is possible to reduce warping and peeling off due to a temperature change.

The difference (absolute value) in an average linear expansion coefficient between the reinforcing plate 3 and the substrate 2 is appropriately set based on the dimensional shape or the like of the substrate 2. The difference in average linear expansion coefficient is preferably $35 \times 10^{-7}/°$ C. or less. Here, the "average linear expansion coefficient" means an average linear expansion coefficient (JIS R 3102 in 1995) in a temperature range of 50° C. to 300° C.

The thickness of the reinforcing plate 3 is set to 0.7 mm or less, and is set based on the type of the reinforcing plate 3, the type and thickness of the substrate 2 to be reinforced, and the like. The thickness of the reinforcing plate 3 may be thicker or thinner than the substrate 2, but in order to reinforce the substrate 2, it is preferably 0.4 mm or more.

In this example, the reinforcing plate 3 is configured to include one sheet of substrate, but the reinforcing plate 3 can be configured to include a laminate in which a plurality of sheets of substrate are laminated.

[Resin Layer]

In order to suppress peeling between the resin layer 4 and the reinforcing plate 3, in the resin layer 4 serving as the adsorption layer, the bonding force between the resin layer 4 and the reinforcing plate 3 is set to be higher than the bonding force between the resin layer 4 and the substrate 2. In this manner, in the step for peeling the laminate 1, the peeling is performed between the resin layer 4 and the substrate 2.

The resin which constitutes the resin layer 4 is not particularly limited, but examples thereof include an acrylic resin, a polyolefin resin, a polyurethane resin, a polyimide resin, a silicone resin, and a polyimide silicone resin. Several types of resins can be mixed and used. Among them, silicone resin and polyimide silicone resin are preferable from the viewpoint of heat resistance and peelability. In the embodiment, a silicone resin layer is exemplified as the resin layer 4.

The thickness of the resin layer 4 is not particularly limited, but it is preferably set to 1 to 50 µm, more preferably 4 to 20 µm. By setting the thickness of the resin layer 4 to 1 µm or more, when air bubbles or foreign matters are mixed between the resin layer 4 and the substrate 2, the thickness of bubbles and foreign matters can be absorbed by deformation of the resin layer 4. On the other hand, the thickness of the resin layer 4 is 50 µm or less, so that the time for forming the resin layer 4 can be shortened, and furthermore, it is economical because the resin of the resin layer 4 is not used more than necessary.

The outer shape of the resin layer 4 is preferably the same as the outer shape of the reinforcing plate 3 or smaller than the outer shape of the reinforcing plate 3 so that the reinforcing plate 3 can support the entire resin layer 4. The outer shape of the resin layer 4 is preferably the same as the outer shape of the substrate 2 or larger than the outer shape of the substrate 2 so that the resin layer 4 can be closely in contact with the entire substrate 2.

In addition, the resin layer 4 is configured to include one layer in FIG. 1, but the resin layer 4 may be configured to include two or more layers. In this case, the total thickness of all the layers constituting the resin layer 4 is the thickness of the resin layer. In addition, in this case, the kind of the resins constituting each layer may be different.

Furthermore, in the embodiment, the resin layer 4 which is an organic film is used as the adsorption layer, but an inorganic layer may be used instead of the resin layer 4. An inorganic film which constitutes the inorganic layer, for example, includes at least one selected from the group consisting of metal silicide, nitride, carbide, and carbonitride.

The metal silicide includes, for example, at least one type selected from the group consisting of W, Fe, Mn, Mg, Mo, Cr, Ru, Re, Co, Ni, Ta, Ti, Zr, and Ba, but is preferably tungsten silicide.

The nitride includes, for example, at least one type selected from the group consisting of Si, Hf, Zr, Ta, Ti, Nb, Na, Co, Al, Zn, Pb, Mg, Sn, In, B, Cr, Mo, and Ba, but is preferably aluminum nitride, titanium nitride, or silicon nitride.

The carbide includes, for example, at least one type selected from the group consisting of Ti, W, Si, Zr, and Nb, but is preferably silicon carbide.

The carbonitride includes, for example, at least one type selected from the group consisting of Ti, W, Si, Zr, and Nb, but is preferably silicon carbonitride.

In metal silicide, nitride, carbide, and carbonitride, the difference in electronegativity between Si, N or C included in the material thereof and other elements included in the material thereof is small and the polarization is small. Therefore, the reactivity between the inorganic film and water is low, and hydroxyl groups are less likely to be formed on the surface of the inorganic film. Accordingly, the releasability between the inorganic film and the substrate 2 which is the glass substrate is maintained satisfactory.

[Laminate Having Functional Layer Formed Therein]

The functional layer is formed on the front surface 2*a* of the substrate 2 of the laminate 1 through the functional layer forming step. As a method of forming the functional layer, a vapor deposition method such as a chemical vapor deposition (CVD) method or a physical vapor deposition (PVD) method, or a sputtering method is used. The functional layer is formed in a predetermined pattern by photolithography method or etching method.

Figure 2:
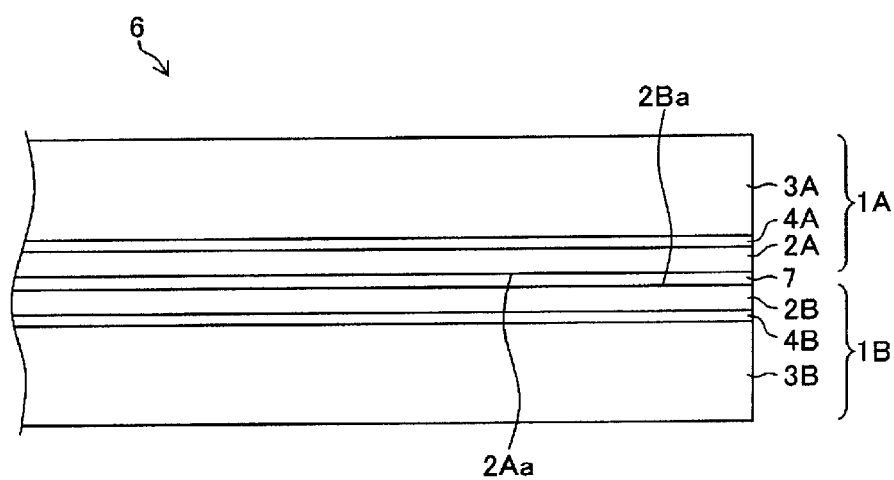
FIG. 2 is an enlarged side view of a main part illustrating an example of a laminate produced during a step for manufacturing an LCD.

FIG. 2 is an enlarged side view of a main part illustrating an example of a laminate 6 produced during a step for manufacturing an LCD.

The laminate 6 is configured by laminating a reinforcing plate 3A, a resin layer 4A, a substrate 2A, a functional layer 7, a substrate 2B, a resin layer 4B, and a reinforcing plate 3B in this order. That is, the laminate 6 in FIG. 2 corresponds to a laminate in which the laminates 1 illustrated in FIG. 1 are disposed symmetrically with the functional layer 7 interposed therebetween. Hereinafter, the laminate including the substrate 2A, the resin layer 4A and the reinforcing plate 3A is referred to as a first laminate 1A, and the laminate including the substrate 2B, the resin layer 4B and the reinforcing plate 3B is referred to as a second laminate 1B.

A thin film transistor (TFT) as the functional layer 7 is formed on the front surface 2Aa of the substrate 2A of the first laminate 1A. A color filter (CF) as the functional layer 7 is formed on the front surface 2Ba of the substrate 2B of the second laminate 1B.

The first laminate 1A and the second laminate 1B are integrated with each other by superimposing the front surfaces 2Aa and 2Ba of the substrates 2A and 2B. In this manner, the laminate 6 having the structure in which the first laminate 1A and the second laminate 1B are disposed symmetrically with each other with the functional layer 7 interposed therebetween is produced.

In the laminate 6, the reinforcing plates 3A and 3B are peeled in the peeling step, and thereafter a polarizing sheet, a backlight and the like are attached to manufacture the LCD as a product.

The laminate 6 in FIG. 2 has a configuration in which the reinforcing plates 3A and 3B are disposed on both of the front and rear surfaces, but as the laminate, a reinforcing plate may be configured to be disposed only on one side surface.

[Peeling Starting Portion Preparing Device]

Figure 3:
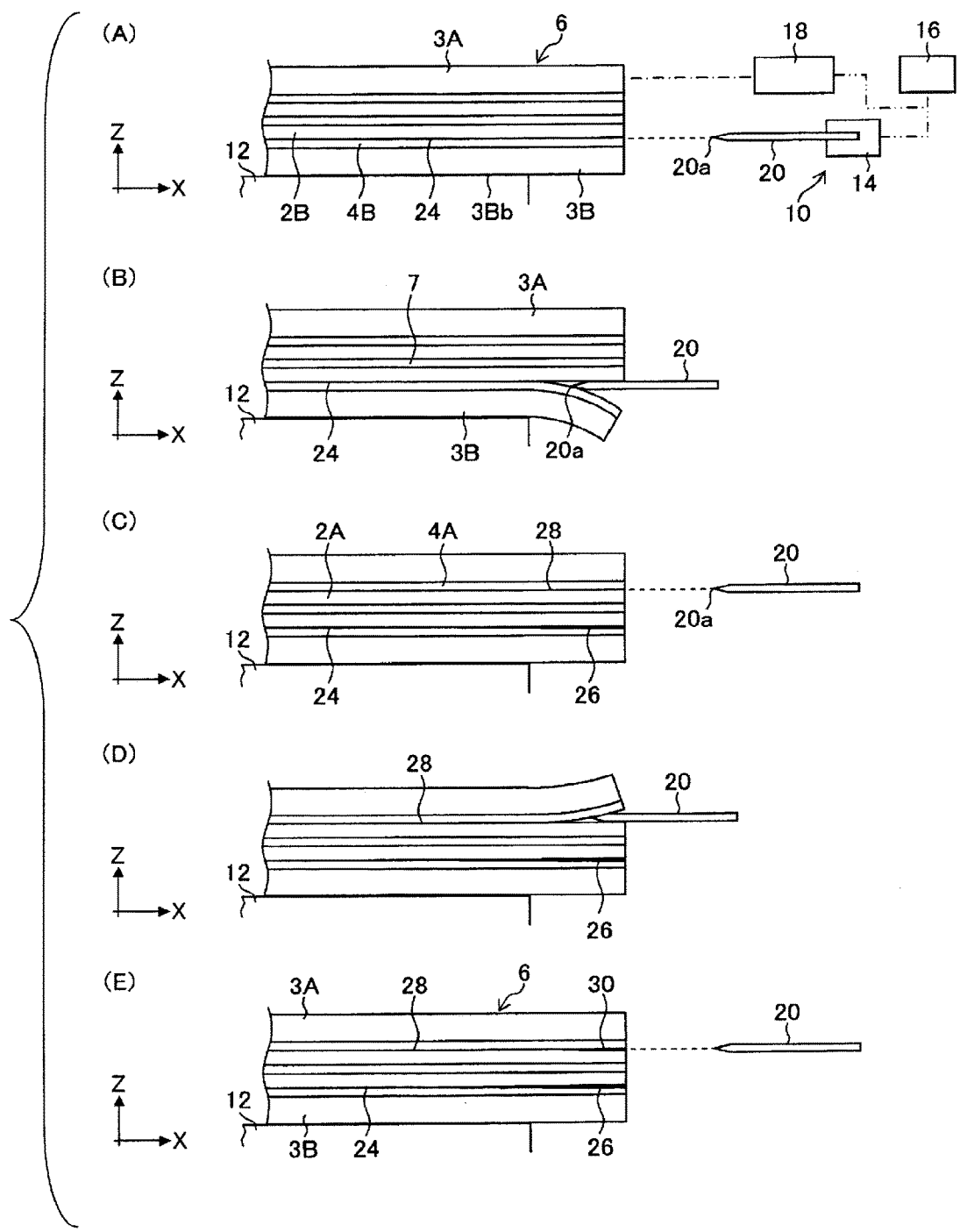
FIG. 3 (A) to (E) of FIG. 3 are explanatory diagrams illustrating a peeling starting portion preparing method by a peeling starting portion preparing device.
Figure 4:
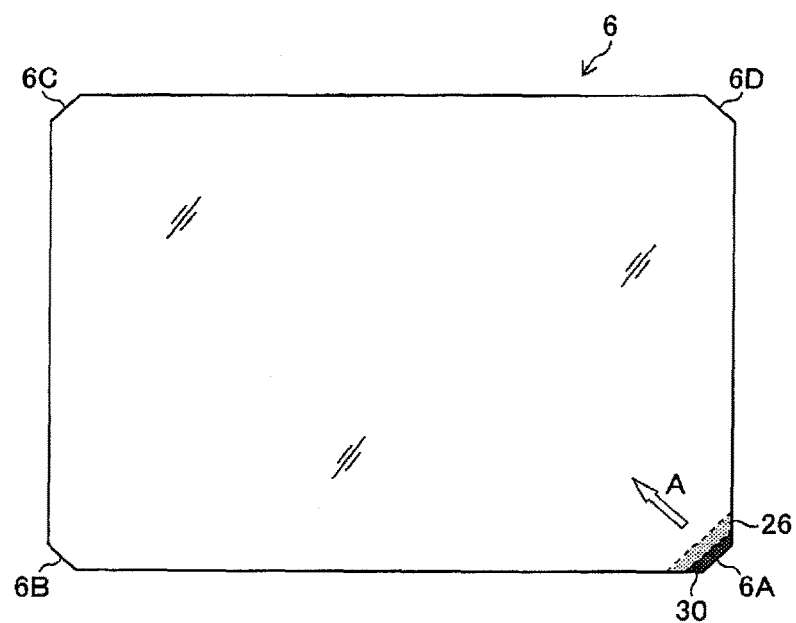
FIG. 4 is a plan view of a laminate in which a peeling starting portion is prepared by the peeling starting portion preparing method.
Figure 5:
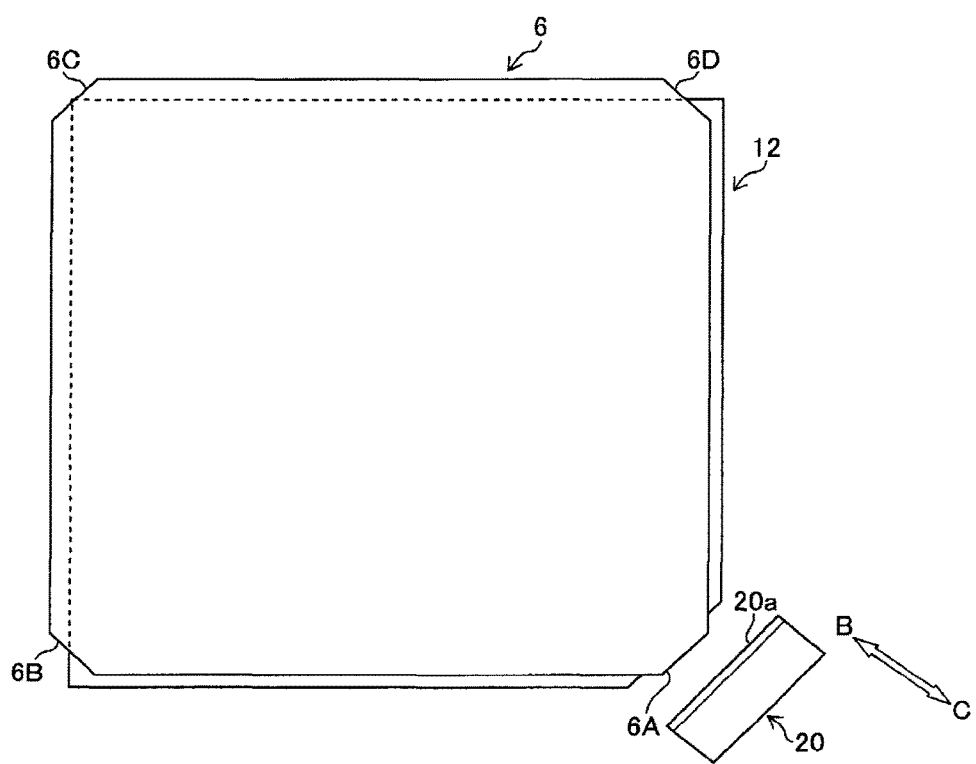
FIG. 5 is a plan view illustrating a state before a knife is inserted into a laminate.

(A) to (E) of FIG. 3 are explanatory diagrams illustrating a configuration of a main part of a peeling starting portion preparing device 10 used in a peeling starting portion preparing step. (A) of FIG. 3 is an explanatory diagram illustrating a positional relationship between the laminate 6 and the knife 20 (also referred to as peeling blade). (B) of FIG. 3 is an explanatory diagram for preparing a peeling starting portion 26 at an interface 24 between the substrate 2B and the resin layer 4B by the knife 20. (C) of FIG. 3 is an explanatory diagram illustrating a state immediately before a peeling starting portion 30 is prepared at an interface 28 between the substrate 2A and the resin layer 4A. (D) of FIG. 3 is an explanatory diagram for preparing the peeling starting portion 30 at the interface 28 by the knife 20. (E) of FIG. 3 is an explanatory diagram of the laminate 6 in which the peeling starting portions 26 and 30 are prepared. In addition, FIG. 4 is a plan view of the laminate 6 in which the peeling starting portions 26 and 30 are prepared. FIG. 5 is a plan view illustrating a state before the knife 20 is inserted into (also referred to as "pierces") the laminate 6.

In FIG. 4, corner cut portions 6A, 6B, 6C, and 6D are provided at each corner portion of the laminate 6. The corner cut portions 6A to 6D are notches chamfered in a tapered shape by a grinding stone, and indicate the model number of the laminate 6, and thus the chamfer amount and chamfer angle thereof are different for each model number. In the laminate 6 in FIG. 4, the corner cut portions 6A to 6D are provided at all corners, but there are laminates in which corner cut portions are provided at least one selected corner portion. In addition, in FIGS. 4 and 5, the corner cut portions 6A to 6D are exaggeratingly illustrated with respect to the size of the laminate 6, but the portions are actually minute sizes.

When the peeling starting portions 26 and 30 are prepared, as in (A) of FIG. 3, in the laminate 6, the rear surface of the reinforcing plate 3B is adsorbed to and held by a table 12 serving as a laminate holding means and is supported in a horizontal direction (X axis direction in the drawing).

As in FIG. 5, the knife 20 is supported by a holder 14 serving as a knife holding means in FIG. 3 in the horizontal direction so that a cutting edge 20*a* faces a corner cut portion 6A of the laminate 6. In addition, the position of the knife 20 in the height direction (Z axis direction in the drawing) is adjusted by a height adjustment device 16. Furthermore, the knife 20 and the laminate 6 are relatively moved in the horizontal direction (X direction in the drawing) by a feeding device 18 such as a ball screw device or the like serving as a moving means. The feeding device 18 may move at least one of the knife 20 and the table 12 in the horizontal direction, and the knife 20 is moved in the embodiment.

[Peeling Starting Portion Preparing Method]

According to the peeling starting portion preparing method by the peeling starting portion preparing device 10, the inserting position of the knife 20 is set at a position which is the corner cut portion 6A of the laminate 6 and overlaps in the thickness direction of the laminate 6, and the insertion amount of the knife 20 is set to be different for each of the interfaces 24 and 28.

The preparing procedure thereof will be described.

In the initial state, the cutting edge 20a of the knife 20 presents at a position shifted in the height direction (Z axis direction) with respect to the interface 24 between the substrate 2B and the resin layer 4B, which is the first insertion position. Therefore, first, as illustrated in (A) of FIG. 3, the knife 20 is moved in the height direction, and the height of the cutting edge 20a of the knife 20 is set to the height of the interface 24.

Thereafter, the knife 20 is moved toward the corner cut portion 6A of the laminate 6 in the horizontal direction (direction of arrow B in FIG. 5) and the cutting edge 20a of the knife 20 is brought into contact with the end surface of the corner cut portion 6A, and then the cutting edge 20a is inserted into the interface 24 with a predetermined amount, as in (B) of FIG. 3.

Next, the knife 20 is pulled out from the corner cut portion 6A in the horizontal direction (direction of arrow C in FIG. 5), and the cutting edge 20a of the knife 20 is set to the height of the interface 28 between the substrate 2A and the resin layer 4A, which is the second insertion position, as in (C) of FIG. 3.

Thereafter, the knife 20 is moved toward the laminate 6 in the horizontal direction (direction of arrow B in FIG. 5) and the cutting edge 20a of the knife 20 is brought into contact with the end surface of the corner cut portion 6A, and then the cutting edge 20a is inserted into the interface 28 with a predetermined amount, as in (D) of FIG. 3. In this manner, the peeling starting portion 30 is prepared at the interface 28 as in (D) of FIG. 3. Here, the insertion amount of the knife 20 for the interface 28 is set to be smaller than the insertion amount for the interface 24. The above is the peeling starting portion preparing method. The insertion amount of the knife 20 for the interface 24 may be set to be smaller than the insertion amount for the interface 28.

The laminate 6 in which the peeling starting portions 26 and 30 are prepared is taken out from the peeling starting portion preparing device 10 and moves to the peeling step. In the peeling step, the laminate 6 is sequentially peeled at the interfaces 24 and 28 by a peeling device.

Although a peeling method of the interfaces 24 and 28 will be described later, the laminate 6 is curved from the corner cut portion 6A toward a corner cut portion 6C facing the corner cut portion 6A, as an arrow A in FIG. 4. Then, the interface 24 having a large area of the peeling starting portion 26 is first peeled from the peeling starting portion 26 as a starting point. In this manner, the reinforcing plate 3B is peeled. Thereafter, the laminate 6 is again curved from the corner cut portion 6A toward the corner cut portion 6C, and thus the interface 28 having a small area of the peeling starting portion 30 is peeled from the peeling starting portion 30 as a starting point. In this manner, the reinforcing plate 3A is peeled. The insertion amount of the knife 20 is set to preferably 7 mm or more, more preferably approximately 15 to 20 mm, based on the size of the laminate 6.

SUMMARY OF THE INVENTION

Features of the peeling starting portion preparing method of the laminate, and the peeling starting portion preparing device according to the present invention will be described. The feature of the present invention resides in the peeling starting portion preparing method by using a knife 20 having a specific shape, and this point will be described below.

The knife 20 of the embodiment used in the peeling starting portion preparing device 10 has a shape which is capable of scraping off at least a part of the resin layer 4B when the knife 20 is inserted into the interface 24, or is capable of scraping off at least a part of the resin layer 4A when the knife 20 is inserted into the interface 28. By scraping off at least a part of the resin layer 4A, it is possible to suppress the reattachment of the substrate 2A and the reinforcing plate 3A. In addition, by scraping off at least a part of the resin layer 4B, it is possible to suppress the reattachment of the substrate 2B and the reinforcing plate 3B.

Next, an action capable of suppressing the reattachment of the substrate and the reinforcing plate will be described by taking the substrate 2A, the reinforcing plate 3A and the resin layer 4A as an example. First, in a state before the knife 20 is inserted into the interface 28, the substrate 2A and the reinforcing plate 3A are attached via the resin layer 4A ((A) of FIG. 3). Next, when the knife 20 is inserted into the interface 28, at least a part of the resin layer 4A is scraped off by the knife 20 along the inserting direction (moving direction) of the knife 20, and linear scratch is formed in the resin layer 4A ((D) of FIG. 3). When the resin layer 4A is scraped off by the knife 20, a portion of the scraped resin layer 4A, so-called chips, attaches to the resin layer 4A or the substrate 2A. The chips play the role of a spacer, and it is possible to suppress the reattachment of the substrate 2A and the reinforcing plate 3A at the peeling starting portion 30. In addition, on both edge portions of the linear scratch formed in the resin layer 4A, projecting portions higher than the adjacent resin layer 4A may be formed in some cases. These projecting portions play the role of the spacer similar to the chips, and it is possible to suppress the reattachment of the substrate 2A and the reinforcing plate 3A at the peeling starting portion 30. Similarly, it is possible to suppress the reattachment of the substrate 2B and the reinforcing plate 3B at the peeling starting portion 26.

[Knife]

Figure 6:
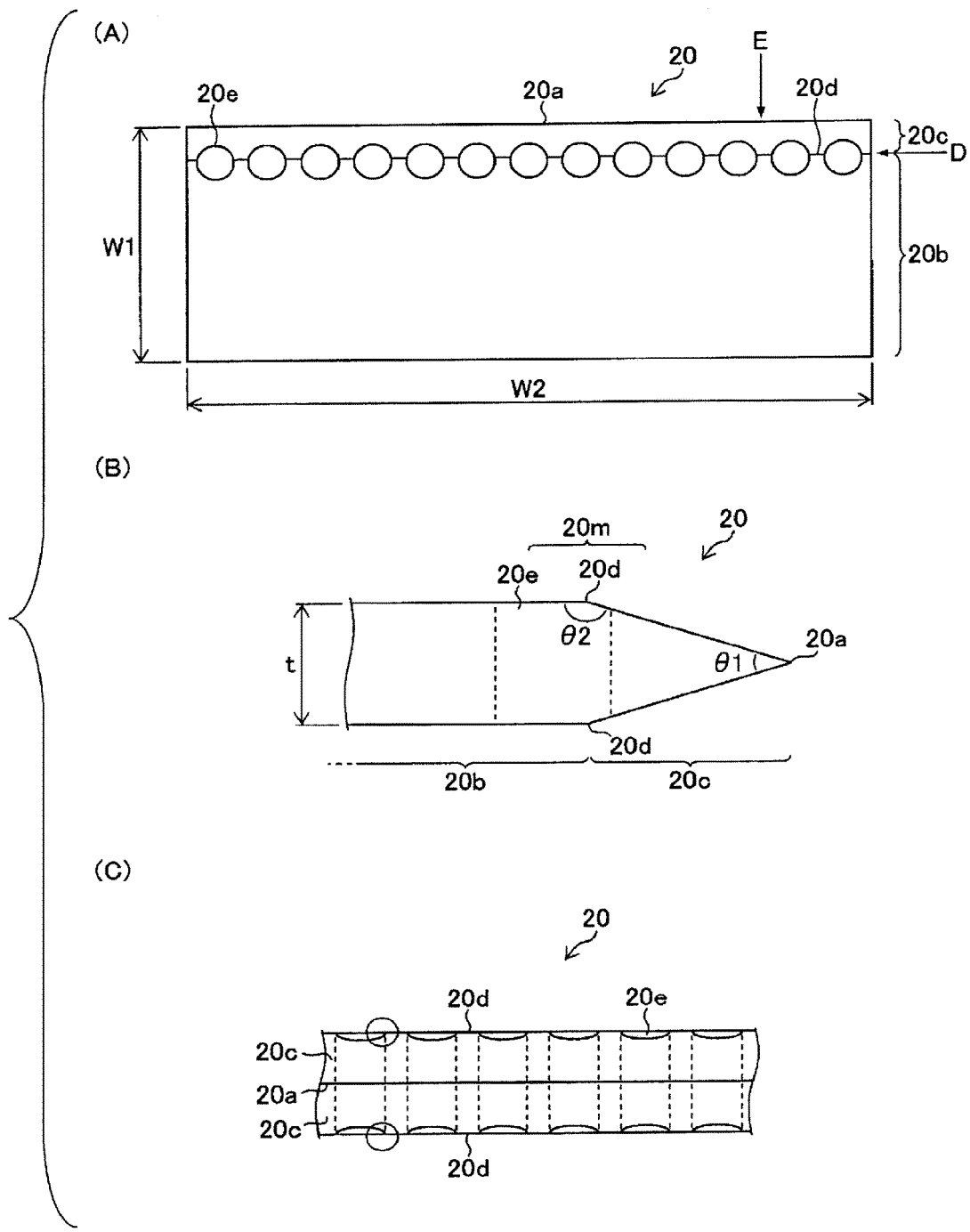
FIG. 6 (A) to (C) of FIG. 6 are explanatory diagrams illustrating a knife according to an embodiment.

The shape of the knife 20 capable of scraping the resin layers 4A and 4B serving as the adsorption layers will be described. (A) to (C) of FIG. 6 illustrate a knife 20 according to an embodiment. (A) of FIG. 6 is a plan view of the knife 20, (B) of FIG. 6 is a side view of the knife 20 viewed from the direction of an arrow D, and (C) of FIG. 6 is a front view viewed from the direction of an arrow E. As in (B) of FIG. 6, the knife 20 in the side view is provided with a main body portion 20b having a substantially fixed thickness and a cutting edge portion 20c which is continuous with the main body portion 20b and is tapered toward the cutting edge 20a. In the knife 20, a ridge line 20d which is a boundary between the main body portion 20b and the cutting edge portion 20c is formed. The ridge line 20d extends substantially in parallel with the cutting edge 20a along the width direction of the knife 20. In the embodiment, an area including the ridge line 20d, within a range of 5 mm on the side of the main body portion 20b from the ridge line 20d, and a half of the length of the cutting edge portion 20c on the side of the cutting edge portion 20c from the ridge line 20d is referred to as a ridge line portion 20m.

As in (B) of FIG. 6, since the cutting edge 20a of the knife 20 is located at the approximate center in the thickness direction of the main body portion 20b and tapered toward the cutting edge 20a thereof, the knife 20 is a double-edged knife. Accordingly, the ridge line 20*d* presents on a first surface and a second surface of the knife 20. Here, the first surface and the second surface of the knife 20 mean two surfaces having large areas in the knife 20 (hereinafter, the first surface and the second surface are also collectively referred to simply as "both surfaces").

In the knife 20 of the embodiment illustrated in (A) to (C) of FIG. 6, a plurality of through holes 20*e* are formed at positions crossing the ridge line 20*d*. The through hole 20*e* has a substantially circular shape in plan view. As in the front view of (C) of FIG. 6, the intersection of the ridge line 20*d* and the through hole 20*e* surrounded by a circle constitutes a projecting portion when viewed from the moving direction of the knife 20. Accordingly, for example, when the knife 20 is inserted into the interface 28, the resin layer 4A can be scraped off by the projecting portion at the intersection of the ridge line 20*d* and the through hole 20*e* (refer to (D) of FIG. 3). Similarly, when the knife 20 is inserted into the interface 24, the resin layer 4B can be scraped off by the projecting portion at the intersection of the ridge line 20*d* and the through hole 20*e* (refer to (B) of FIG. 3).

In (A) of FIG. 6, the through hole 20*e* having a substantially circular shape in the plan view is exemplified, but it may be an elliptical shape, a rectangular shape, a triangular shape, or a polygonal shape. In addition, the size of the through hole 20*e* (here, the length for cutting off the ridge line 20*d*) is preferably 0.1 to 5 mm, and a pitch of the plurality of through holes 20*e* is preferably larger than the size of the through hole 20*e* and even may be irregular pitch. The size and pitch of the through hole 20*e* can be appropriately set.

The width W1 of the knife 20 is preferably 5 to 50 mm, the length W2 thereof is preferably 30 to 200 mm, and the thickness t thereof is preferably 0.05 to 0.5 mm. An angle $\theta 1$ of the cutting edge portion 20*c* is preferably 20° to 30° and the angle $\theta 2$ formed by the main body portion 20*b* and the cutting edge portion 20*c* is preferably 165° to 170°.

Figure 7:
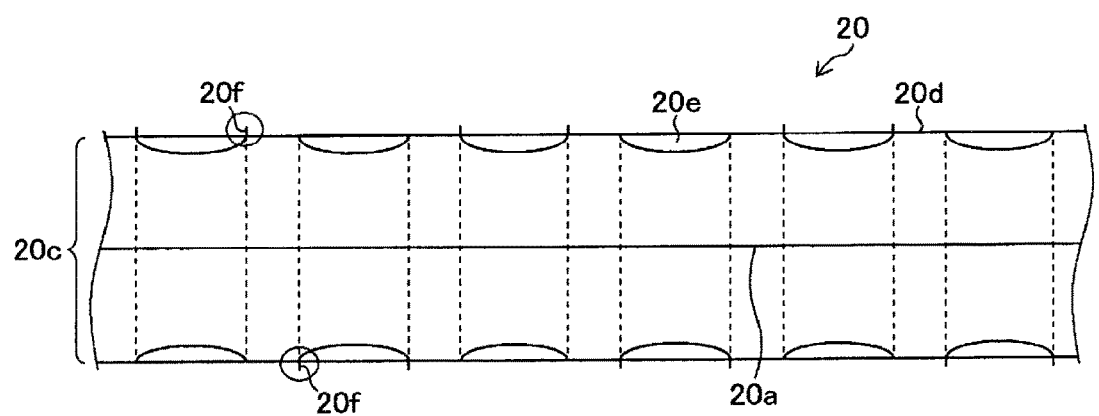
FIG. 7 is an explanatory diagram illustrating another embodiment of the knife in FIG. 6.

FIG. 7 is another embodiment of the knife 20 of the embodiment of (A) to (C) of FIG. 6. FIG. 7 is a front view viewed from the cutting edge 20*a* similar to (C) of FIG. 6. As in FIG. 7, in the knife 20, the through holes 20*e* are formed so that the plurality of through holes 20*e* cross the ridge line 20*d*. In the knife 20 of this embodiment, a burr 20*f* is formed in the through hole 20*e*. By forming the burr 20*f*, the protruding portion at the intersection of the ridge line 20*d* and the through hole 20*e* can be made sharp shape. As a result, the resin layer can be scraped off with high reliability by the burr 20*f*.

In addition, as in FIG. 7, in at least two through holes 20*e*, the projecting directions of the burrs 20*f* are preferably opposite to each other. The resin layer can be scraped off by the knife 20 even if the resin layer is disposed to face either side of both surfaces of the knife 20.

The burrs 20*f* can be formed around the through hole 20*e* by punching the knife 20. In addition, the through hole 20*e* is formed by punching from the first surface of the knife 20, and the through hole 20*e* is formed by punching from the second surface of the knife 20 at the other position, and thus the burrs 20*f* whose projecting directions are opposite to each other can be formed on both surfaces of the knife 20.

Figure 8:
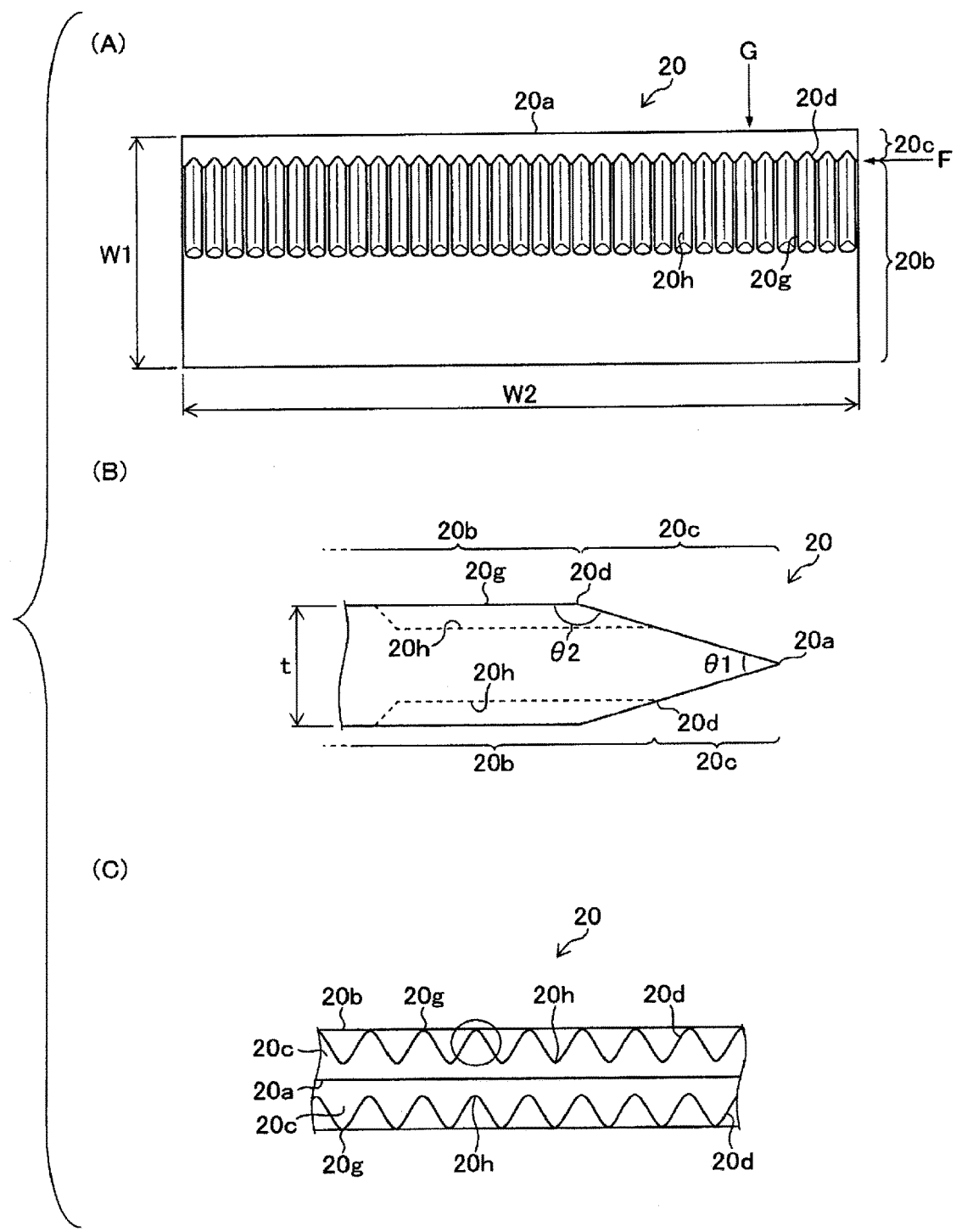
FIG. 8 (A) to (C) of FIG. 8 are explanatory diagrams illustrating a knife according to another embodiment.

(A) to (C) of FIG. 8 illustrate the knife 20 according to another embodiment. (A) of FIG. 8 is a plan view of the knife 20, (B) of FIG. 8 is a side view of the knife 20 viewed from the direction of an arrow F, and (C) of FIG. 8 is a front view viewed from the direction of an arrow G. As in (B) of FIG. 8, similar to (A) to (C) of FIG. 6, the knife 20 is provided with a main body portion 20*b*, a cutting edge portion 20*c*, and a ridge line 20*d* which is a boundary between the main body portion 20*b* and the cutting edge portion 20*c*, with the cutting edge 20*a* positioned at a substantially central portion in the thickness direction of the main body portion 20*b*, and is a double-edged knife.

As in (A) of FIG. 8, a crest portion 20*g* and a valley portion 20*h* which extend in a substantially vertical direction to the cutting edge 20*a* are alternately formed on both surfaces of the main body portion 20*b* of the knife 20 of the embodiment. Accordingly, as illustrated in (A) of FIG. 8, the ridge line 20*d*, which is a boundary between the main body portion 20*b* and the cutting edge portion 20*c* is a wavy shape in a plan view. A wavy shape means a case where a certain shape undulates with a fixed interval and does not mean that the shape is a wave itself. Accordingly, the crest portion 20*g* and the valley portion 20*h* may be in a V shape, a U shape or the like in a front view.

As illustrated in (B) of FIG. 8, the positions of the ridge line 20*d* between the main body portion 20*b* and the cutting edge portion 20*c* in the crest portion 20*g*, and the ridge line 20*d* between the main body portion 20*b* and the cutting edge portion 20*c* in the valley portion 20*h* in the side view are different from each other in the thickness direction of the knife 20 and in the length direction thereof (direction of W1). In addition, as in (C) of FIG. 8, in the front view, the cutting edge portion 20*c* is formed in a wavy shape by the crest portion 20*g* and the valley portion 20*h*.

In the knife 20 of the embodiment, the ridge line 20*d* surrounded by a circle constitutes a projecting portion when viewed from the moving direction of the knife 20. Accordingly, when the knife 20 is inserted into the interface 28, the resin layer 4A can be scraped off by the ridge line 20*d* serving as the projecting portion (refer to (D) of FIG. 3). Similarly, when the knife 20 is inserted into the interface 24, the resin layer 4B can be scraped off by the ridge line 20*d* serving as the projecting portion (refer to (B) of FIG. 3).

The knife 20 illustrated in FIG. 8 can be produced, for example, by grinding a flat plate in which the crest portion and the valley portion are alternately formed in a direction in which the crest portion and the valley portion extend to form a cutting edge portion.

The material, the width W1, the length W2, and the thickness t of the knife 20, the angle $\theta 1$ of the cutting edge portion 20*c*, and the angle $\theta 2$ formed by the main body portion 20*b* and the cutting edge portion 20*c* can be made of the same material and size as the knife 20 of FIG. 6.

Figure 9:
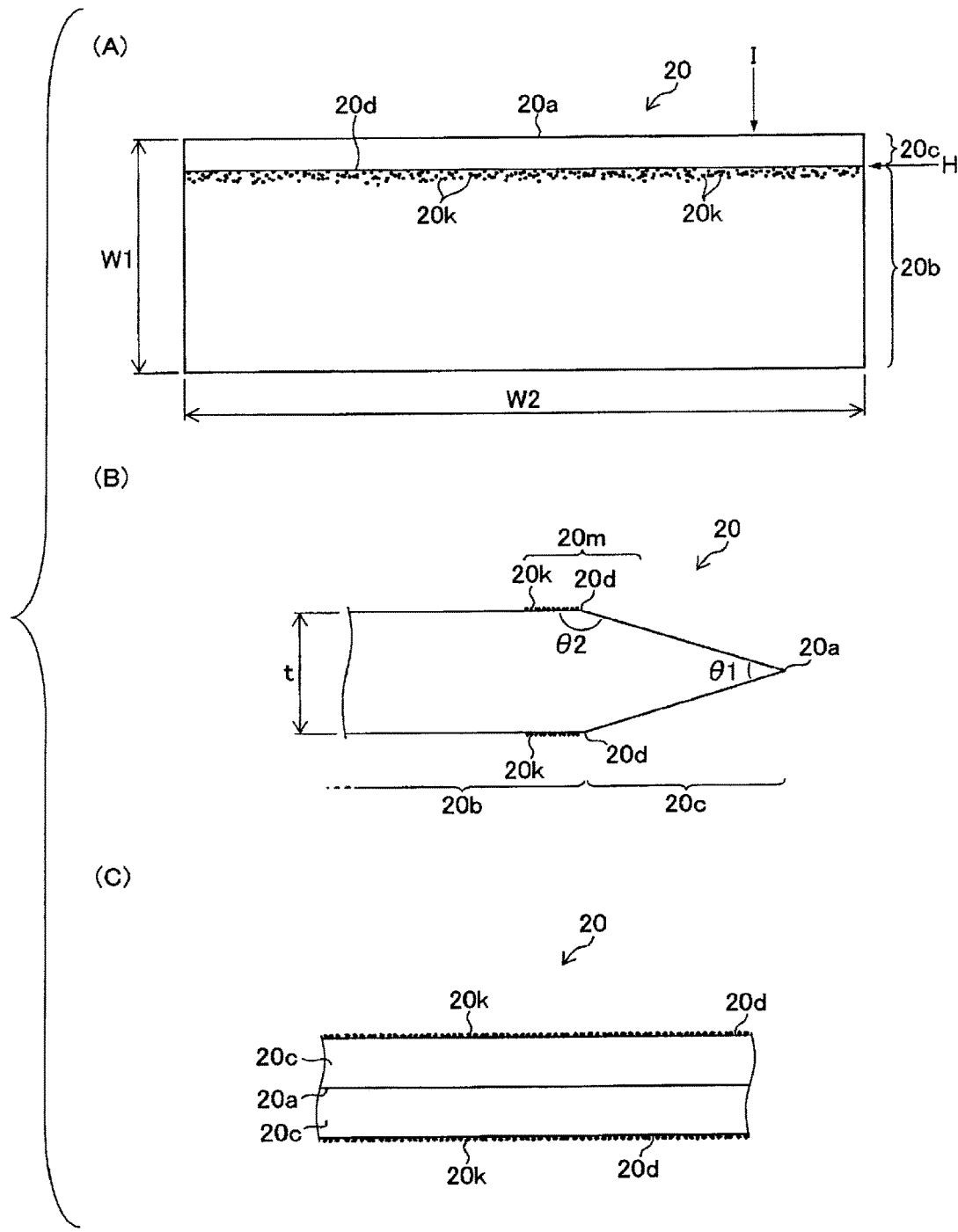
FIG. 9 (A) to (C) of FIG. 9 are explanatory diagrams illustrating the knife according to another embodiment.

(A) to (C) of FIG. 9 illustrate a knife 20 according to another embodiment. (A) of FIG. 9 is a plan view of the knife 20, (B) of FIG. 9 is a side view of the knife 20 viewed from the direction of an arrow H, and (C) of FIG. 9 is a front view viewed from the direction of an arrow I. As in (B) of FIG. 9, similar to (B) of FIG. 6, the knife 20 is provided with a main body portion 20*b*, a cutting edge portion 20*c*, and a ridge line 20*d* which is a boundary between the main body portion 20*b* and the cutting edge portion 20*c*, with the cutting edge 20*a* positioned at a substantially central portion in the thickness direction of the main body portion 20*b*, and is a double-edged knife.

In the knife 20 of the embodiment illustrated in (A) to (C) of FIG. 9, particles 20*k* are attached to the ridge line portions 20*m* including the ridge line 20*d*, which are both surfaces of the knife 20. Since the particles 20*k* attached to both surfaces of the knife 20 constitute the projecting portion, when the knife 20 is inserted into the interface 28, the resin layer 4A can be scraped off by the particles 20*k* (refer to (D) of FIG.

3). Similarly, when the knife 20 is inserted into the interface 24, the resin layer 4B can be scraped off by the particles 20k (refer to (B) of FIG. 3).

As the particles 20k, for example, particles of a material such as diamond, glass, metal, or the like is preferably used. In addition, the particle size of the particles 20k is preferably 0.1 to 100 μm, and the density thereof is preferably 1 to 1,000 particles/cm². As a method of fixing the particles 20k to the ridge line portion 20m of the knife 20, adhesion, electrodeposition by plating or the like can be used.

The material, the width W1, the length W2, and the thickness t of the knife 20, the angle θ1 of the cutting edge portion 20c, and the angle θ2 formed by the main body portion 20b and the cutting edge portion 20c can be made of the same material and size as the knife 20 of (A) to (C) of FIG. 6.

Although as for the knives 20 illustrated in (A) to (C) of FIG. 6 to (A) to (C) of FIG. 9, examples which have the linear cutting edge 20a in plan view are illustrated, they are not limited thereto. For example, the cutting edge 20a may be a wavy shape or a sawtooth shape in plan view.

Figure 10:
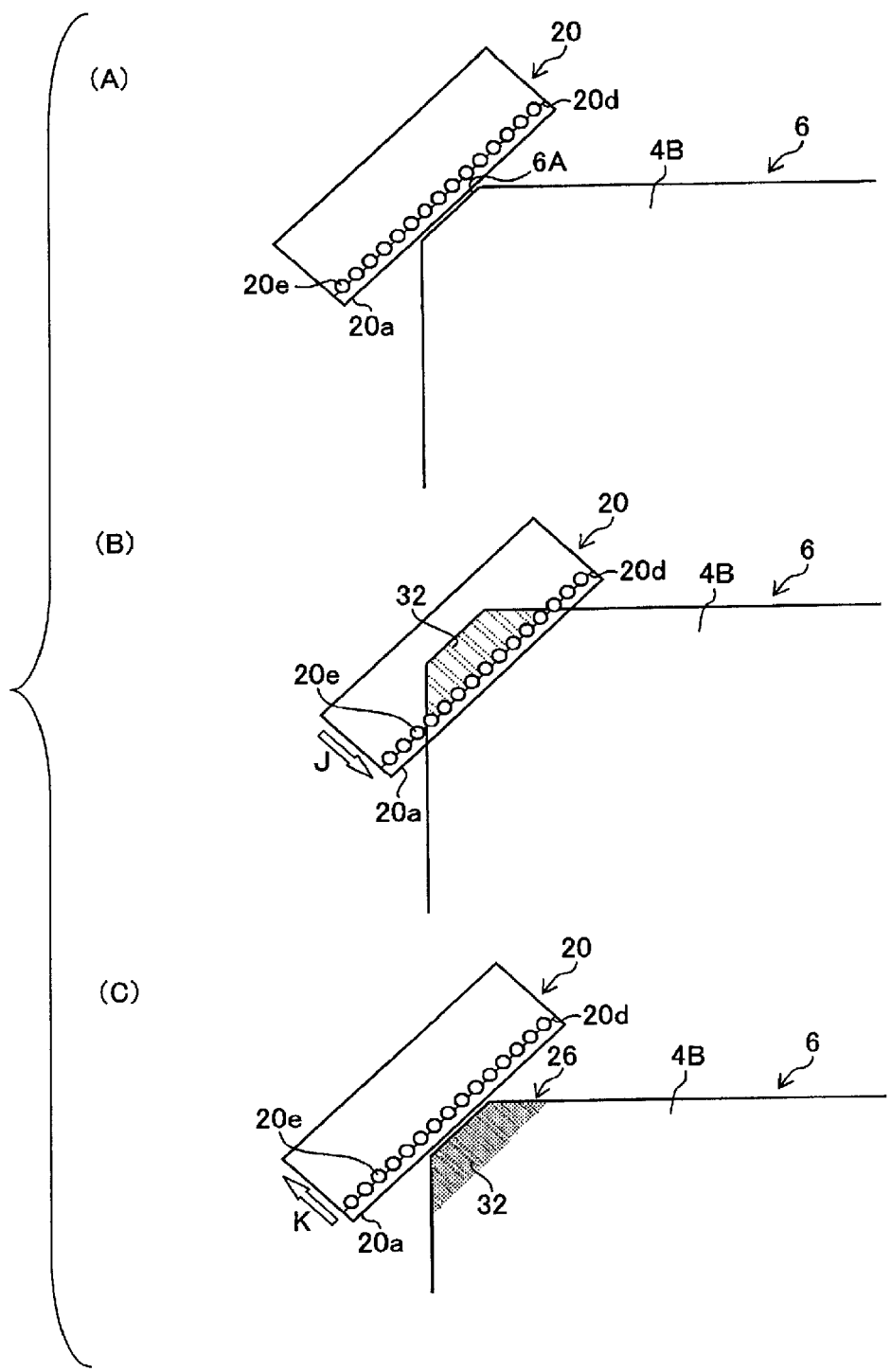
FIG. 10 (A) to (C) of FIG. 10 are plan views illustrating a method of preparing a peeling starting portion in a laminate by using a knife having through holes.
Figure 11:
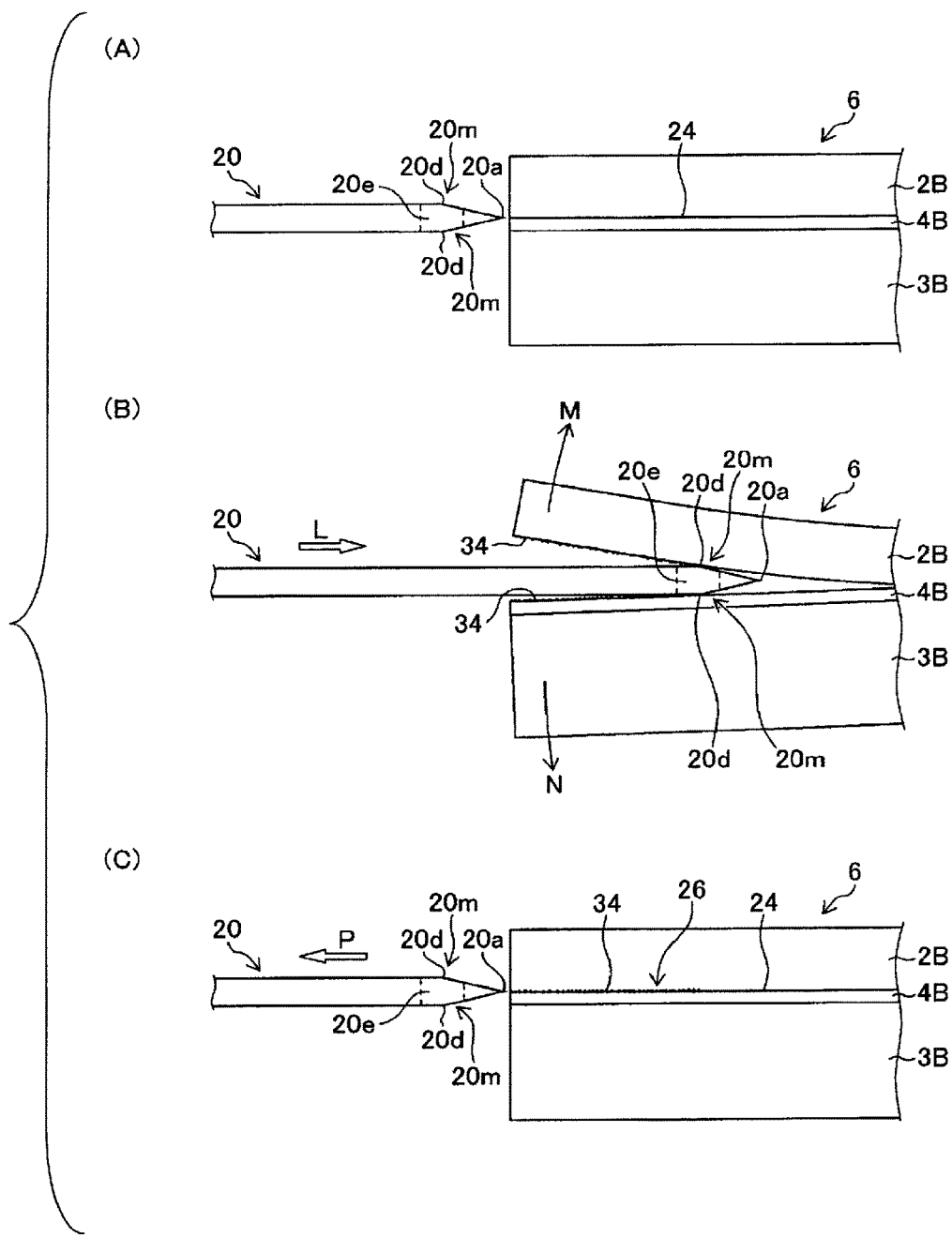
FIG. 11 (A) to (C) of FIG. 11 are side views illustrating the method of preparing the peeling starting portion in the laminate by using the knife having the through holes.

Next, the peeling starting portion preparing method, using the knife 20 having the through hole 20e illustrated in (A) of FIG. 6 will be described. (A) to (C) of FIG. 10 are plan views illustrating a method of preparing a peeling starting portion in a laminate, and (A) to (C) of FIG. 11 are side views illustrating the method of preparing the peeling starting portion in the laminate. As illustrated in (A) of FIGS. 10 and (A) of FIG. 11, the knife 20 is moved in the height direction, and the height of the cutting edge 20a of the knife 20 is set to the height of the interface 24 between the substrate 2B and the resin layer 4B at a position facing the corner cut portion 6A of the laminate 6. In the knife 20, 15 through holes 20e of diameter of 2 mm are formed at positions crossing the ridge line 20d at a pitch of 4 mm. The 15 through holes 20e are disposed substantially parallel to the cutting edge 20a.

In order to facilitate understanding, only the resin layer 4B of the laminate 6 is illustrated in (A) to (C) of FIG. 10, and only the substrate 2B, the reinforcing plate 3B and the resin layer 4B are illustrated in (A) to (C) of FIG. 11.

As illustrated in (B) of FIG. 10, the knife 20 is inserted into the interface 24 with a predetermined insertion amount along the direction of an arrow J (arrow L in (B) of FIG. 11). Since the knife 20 is a double-edged knife, the knife 20 moves while respectively pressing and spreading the substrate 2B and the reinforcing plate 3B including the resin layer 4B with respect to the advancing direction of the knife 20 (in (B) of FIG. 11, the substrate 2B is in the direction of an arrow M, and the reinforcing plate 3B including the resin layer 4B is in the direction of an arrow N). When moving the knife 20 along the interface 24, forces in the direction opposite to the arrow M and the arrow N act due to the rigidity of the substrate 2B and the reinforcing plate 3B, and the ridge line portion 20m including the ridge line 20d of the knife 20 is locally pressed against the resin layer 4B. Since the intersection of the through hole 20e and the ridge line 20d constitutes a projecting portion, the resin layer 4B can be easily scraped off by this projecting portion.

As illustrated in (B) of FIG. 10, when the resin layer 4B is scraped off by the knife 20 along the moving direction of the knife 20, a linear scratch 32 corresponding to the moving direction of the knife 20 is formed on the front surface of the resin layer 4B. Since the scratch 32 is formed while scraping the resin layer 4B by the knife 20, chips 34 are attached to the substrate 2B and the resin layer 4B as illustrated in (B) of FIG. 11. In addition, projecting portions (not illustrated) higher than the adjacent resin layer 4B are formed at both linear edge portions of the scratch 32.

As illustrated in (C) of FIG. 10, the knife 20 is pulled out in the direction of an arrow K (arrow P in FIG. 11) opposite to the direction of an arrow J (arrow L in FIG. 11) into which it is inserted. That is, the knife 20 is pulled out so as to trace the track of the advanced knife 20 in reverse. As in (C) of FIG. 10, a peeling starting portion 26 corresponding to the insertion amount of the knife 20 is formed in the vicinity of the corner cut portion 6A.

As illustrated in (C) of FIG. 11, since the chips 34 of the resin layer 4B are present at the interface 24 between the substrate 2B and the resin layer 4B, the chips 34 function as a spacer and the reattachment between the substrate 2B and the resin layer 4B can be suppressed. In addition, as illustrated in (C) of FIG. 10, in a case where projecting portions (not illustrated) are formed at both edge portions of the scratch 32, they function as a spacer.

Next, a case where a knife 20 which has a through hole 20e having a different shape from the knife 20 which has the through hole 20e illustrated in (A) to (C) of FIG. 10 and (A) to (C) of FIG. 11 is used will be described. (A) to (C) of FIG. 12 are plan views illustrating a method of preparing a peeling starting portion in a laminate.

Figure 12:
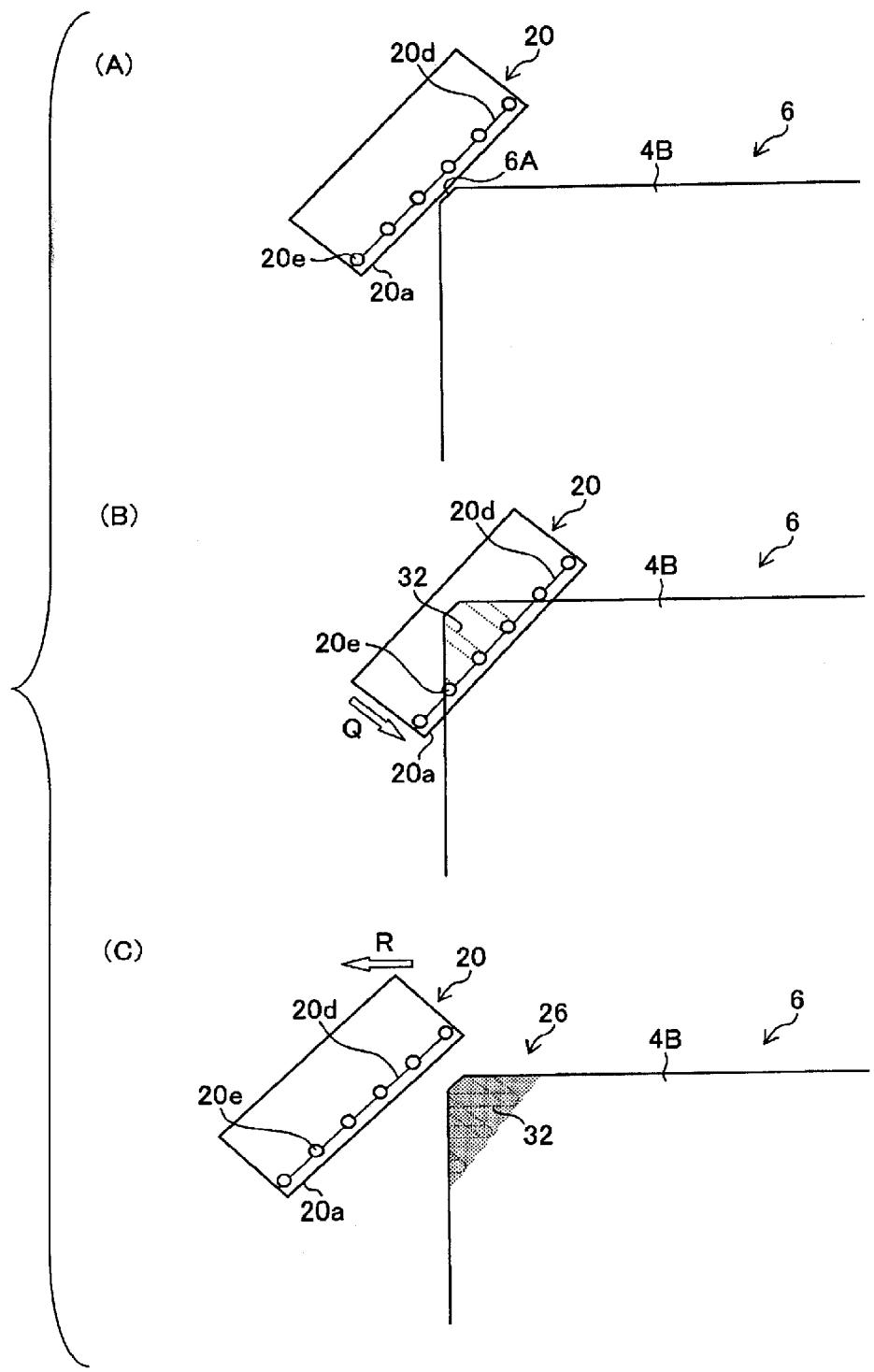
FIG. 12 (A) to (C) of FIG. 12 are plan views illustrating a method of preparing a peeling starting portion in a laminate by using another knife having through holes.

The knife 20 is moved in the height direction as illustrated in (A) of FIG. 12, and the knife 20 is set at a position facing the corner cut portion 6A of the laminate 6. The height of the cutting edge 20a of the knife 20 is set to the height of the interface 24 between the substrate 2B and the resin layer 4B (refer to (A) of FIG. 11).

Next, as illustrated in (B) of FIG. 12, the knife 20 is inserted into the interface 24 along the direction of an arrow Q with a predetermined insertion amount. Scratches 32 are formed along the moving direction of the knife 20 in the resin layer 4B. The number of the through holes 20e of the knife 20 of the embodiment of (A) to (C) of FIG. 12 is small, compared with that of the knife 20 of the embodiment of (A) to (C) of FIG. 10 and (A) to (C) of FIG. 11. Accordingly, the number of scratches 32 formed in the resin layer 4B of the embodiment of (A) to (C) of FIG. 12 is smaller than the number of scratches 32 formed in the resin layer 4B of the embodiment of (A) to (C) of FIG. 10 and (A) to (C) of FIG. 11. As in (B) of FIG. 12, the through hole 20e may not pass through the corner cut portion 6A.

Next, as illustrated in (C) of FIG. 12, the knife 20 is pulled out in the direction of an arrow R (left direction in the drawing), not in the direction opposite to the direction of an arrow Q into which it is inserted. That is, the knife 20 is pulled out so as not to trace the track of the advanced knife 20 in reverse. The knife 20 is pulled out so as not to trace the track in reverse, and thus as in (C) of FIG. 12, a new scratch 32 also can be formed on the resin layer 4B when the knife 20 is pulled out, in addition to the scratch 32 formed when the knife 20 is inserted. Accordingly, even with the knife 20 having a small number of through holes 20e, the moving direction of the knife 20 is controlled, and thus the scratch 32 having the same area as with the knife 20 having a large number of through holes 20e can be formed. The moving direction of the knife 20 is not limited to the embodiment, but is appropriately set depending on the size and number of the through holes 20e.

According to this embodiment, the knife 20 having a small number of through holes 20e and low manufacturing cost can be used.

The double-edged knives 20 are exemplified in (A) to (C) of FIG. 6 to (A) to (C) of FIG. 9, but they are not limited thereto and a single-edged knife can be used.

Figure 13:
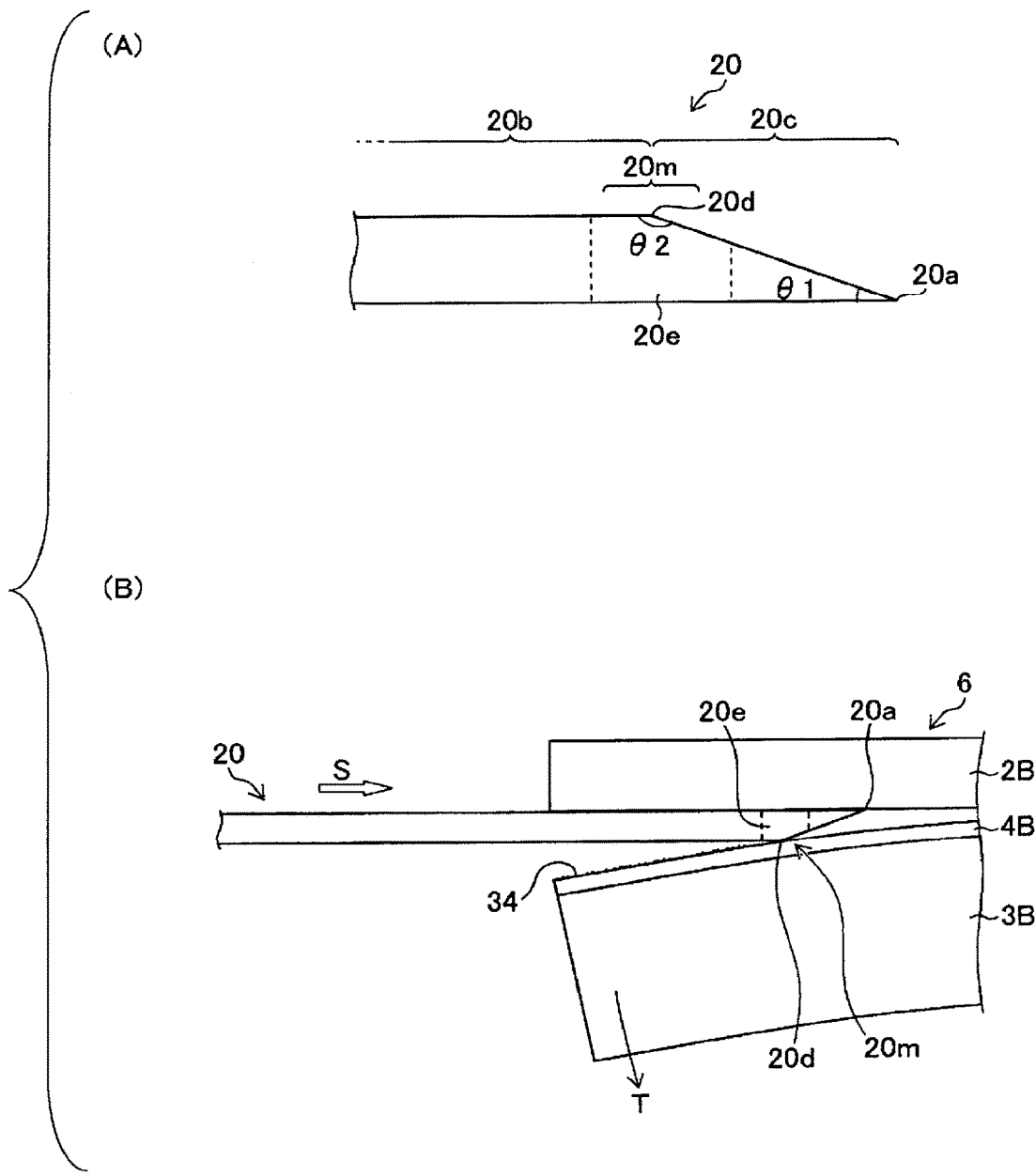
FIGS. 13 (A) and (B) of FIG. 13 are explanatory diagrams illustrating another knife having through holes, and a peeling starting portion preparing method in a laminate by using the knife.

(A) and (B) of FIG. 13 are explanatory diagrams illustrating one embodiment of a single-edged knife. As illustrated in (A) of FIG. 13, the knife 20 is provided with a main body portion 20b having a substantially fixed thickness in a side view, and a cutting edge portion 20c which is continuous with the main body portion 20b and tapered toward the cutting edge 20a. As in (A) of FIG. 13, since the cutting edge 20a of the knife 20 is positioned on the side of one of the first surface and the second surface in the thickness direction of the main body portion 20b, the knife 20 is a single-edged knife. Accordingly, the ridge line 20d presents only on one surface of the first surface and the second surface of the knife 20, and the surface on which the ridge line 20d does not present is a flat surface.

The knife 20 of the embodiment has the plurality of through holes 20e crossing the ridge line 20d, as a shape capable of scraping off the resin layer serving as the adsorption layer. The plurality of through holes 20e are disposed substantially parallel to the cutting edge 20a.

(B) of FIG. 13 is a side view illustrating a state in which the knife 20 is inserted into the laminate 6. In order to facilitate understanding, only the substrate 2B, the reinforcing plate 3B and the resin layer 4B are illustrated.

As in (B) of FIG. 13, the knife 20 is inserted into the interface between the substrate 2B and the resin layer 4B with a predetermined insertion amount along the direction of an arrow S. Since the knife 20 is the single-edged knife, the knife 20 moves while pressing and spreading the reinforcing plate 3B including the resin layer 4B in the direction of an arrow T with respect to the advancing direction of the knife 20. When moving the knife 20 along the interface 24, a force in the direction opposite to the arrow T acts due to the rigidity of the substrate 2B and the reinforcing plate 3B, and the ridge line portion 20m including the ridge line 20d of the knife 20 is locally pressed against the resin layer 4B. Since the intersection of the through hole 20e and the ridge line 20d constitutes a projecting portion, the resin layer 4B can be easily scraped off by this projecting portion.

In the knife 20 of the embodiment, since the ridge line 20d is formed only on one surface, the influence on the substrate 2B can be reduced.

In a case where the single-edged knife 20 is used, when the knife 20 is inserted into the interface 24 in (B) of FIG. 3, as in (A) and (B) of FIG. 13, the knife 20 is disposed at a position in which the ridge line portion 20m of the knife 20 faces the resin layer 4B. On the other hand, when the knife 20 is inserted into the interface 28 in (D) of FIG. 3, it is disposed at a position in which the ridge line portion 20m of the knife 20 faces the resin layer 4A.

In a case where one knife 20 is used, before the knife 20 is inserted into the interface 24 or the interface 28, it is preferable to invert the knife 20 upside down so that the ridge line portion 20m of the knife 20 faces the respective resin layers 4B and 4A.

In addition, in a case where the two knives 20 are used, the knife 20 to be inserted into the interface 24 and the knife 20 to be inserted into the interface 28 are each prepared, and thus the ridge line portions 20m can be disposed to face the resin layers 4A and 4B.

In a case where burrs (not illustrated) are formed on the knife 20 having the through hole 20e, the burrs may be formed in a direction projecting from the surface having the ridge line 20d.

In (A) and (B) of FIG. 13, although a case where the through hole 20e is formed on the ridge line 20d with respect to the single-edged knife 20 is described, the ridge line 20d can be a wavy shape as in (A) to (C) of FIG. 8 or the particles 20k can be disposed at the ridge line portion 20m as in (A) to (C) of FIG. 9.

In a case of a single-edged knife 20, the width W1 and the length W2 can be set similar to those of (A) and (B) of FIG. 6. The thickness t is preferably 0.05 to 0.5 mm. In addition, the angle $\theta 1$ of the cutting edge portion 20c is preferably 10° to 15°, and the angle $\theta 2$ formed by the main body portion 20b and the cutting edge portion 20c is preferably 165° to 170°.

[Peeling Device]

Figure 14:
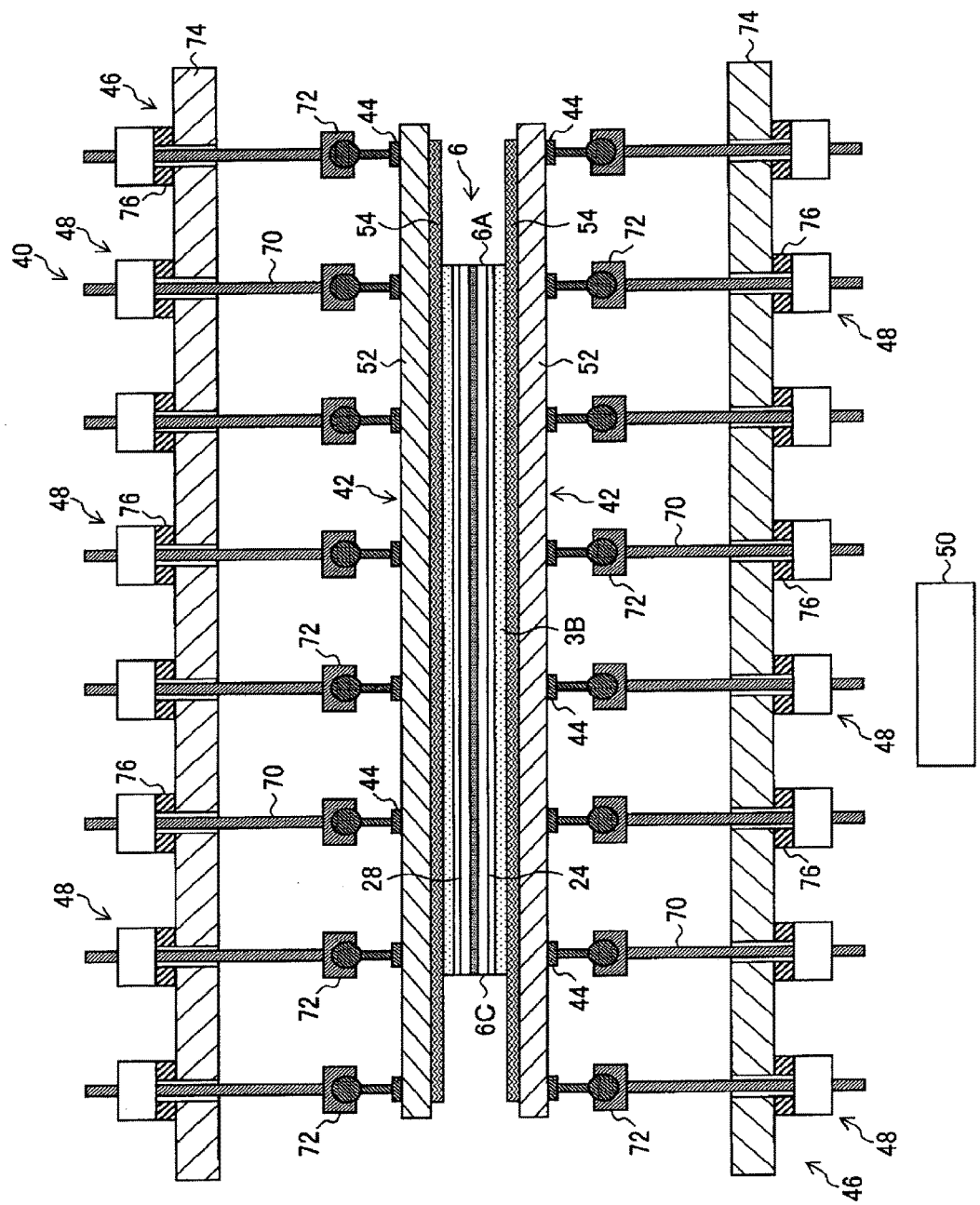
FIG. 14 is a longitudinal sectional view illustrating a configuration of a peeling device.
Figure 15:
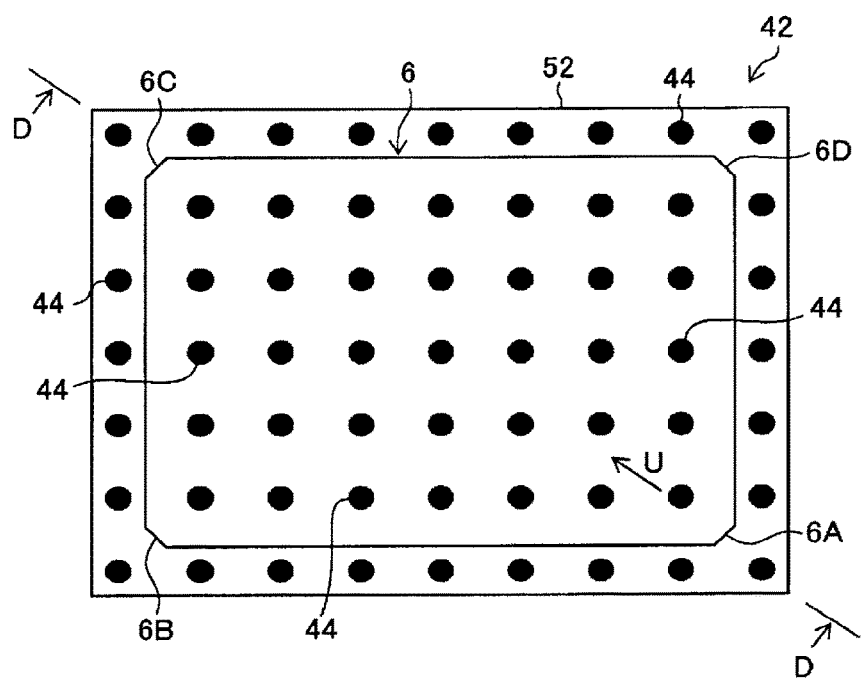
FIG. 15 is a plan view of a flexible plate schematically illustrating an arrangement position of a movable body with respect to a peeling unit.

FIG. 14 is a longitudinal sectional view illustrating a configuration of a peeling device 40 of the embodiment. FIG. 15 is a plan view of a peeling unit 42 schematically illustrating the arrangement positions of a plurality of movable bodies 44 with respect to the peeling unit 42 of a peeling device 40. FIG. 14 corresponds to a cross-sectional view taken along a line D-D of FIG. 15, and the laminate 6 is illustrated by a solid line in FIG. 15.

As in FIG. 14, the peeling device 40 is provided with a pair of movable devices 46 and 46 disposed above and below interposing the laminate 6. Since the movable devices 46 and 46 have the same configuration, here, the movable device 46 disposed on the lower side of FIG. 14 will be described, the same reference numerals are given to the movable devices 46 disposed on the upper side, and the description thereof will be omitted.

The movable device 46 is configured to include a plurality of movable bodies 44, a plurality of drive devices 48 which move the movable body 44 up and down for each movable body 44, a controller 50 that controls the drive device 48 for each drive device 48.

The peeling unit 42 vacuum-adsorbs and holds the reinforcing plate 3B so as to curve and deform the reinforcing plate 3B. Instead of vacuum adsorption, electrostatic adsorption or magnetic adsorption may be performed.

[Peeling Unit]

Figure 16:
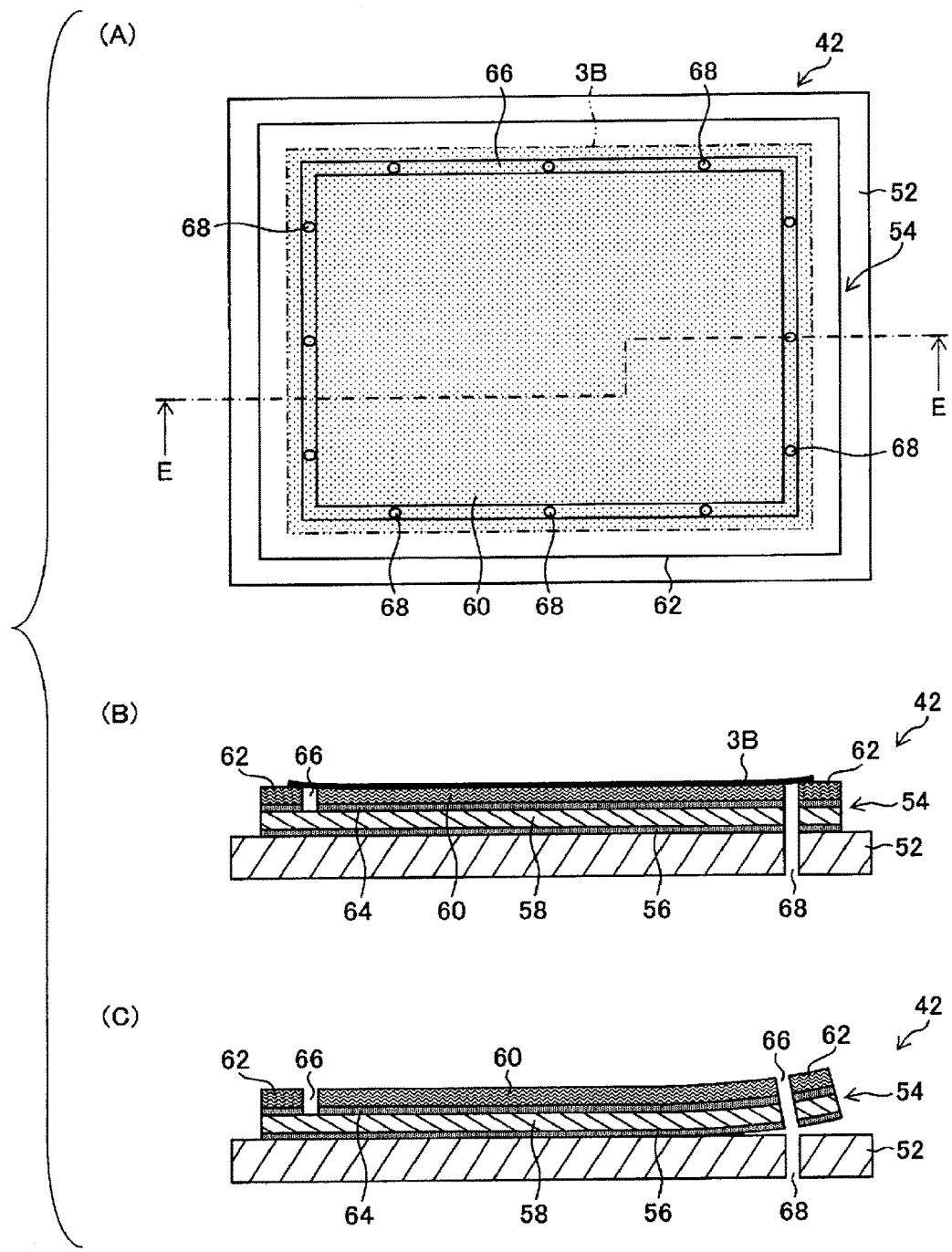
FIG. 16 (A) to (C) of FIG. 16 are explanatory diagrams illustrating a configuration of a peeling unit.

(A) of FIG. 16 is a plan view of the peeling unit 42, and (B) of FIG. 16 is an enlarged longitudinal sectional view of the peeling unit 42 taken along with line E-E of (A) of FIG. 16. In addition, (C) of FIG. 16 is an enlarged longitudinal sectional view of the peeling unit 42 illustrating that an adsorbing portion 54 constituting the peeling unit 42 is attachably and detachably provided on a rectangular plate-like flexible plate 52 constituting the peeling unit 42 via a double sided adhesive tape 56.

The peeling unit 42 is configured by attachably and detachably attaching the adsorption portion 54 to the flexible plate 52 via the double sided adhesive tape 56 as described above.

The adsorption portion 54 is provided with a flexible plate 58 of which the thickness is thinner than that of the flexible plate 52. The lower surface of the flexible plate 58 is attachably and detachably attached to the upper surface of the flexible plate 52 via the double sided adhesive tape 56.

In addition, the adsorption portion 54 is provided with a rectangular air permeable sheet 60 adsorbing and holding the inner surface of the reinforcing plate 3B of the laminate 6. The thickness of the air permeable sheet 60 is 2 mm or less, preferably 1 mm or less, for the purpose of reducing the tensile stress generated in the reinforcing plate 3B at the time of peeling, and one having the thickness of 0.5 mm is used in the embodiment.

Furthermore, the adsorption portion 54 is provided with a seal frame member 62 which surrounds the air permeable sheet 60, and on which the outer peripheral surface of the reinforcing plate 3B abuts. The sealing frame member 62 and the air permeable sheet 60 are attached to the upper surface of the flexible plate 58 via the double sided adhesive tape 64. In addition, the seal frame member 62 is a closed-cell sponge having a Shore E hardness of 20 degrees or more and 50 degrees or less, and the thickness thereof is configured to be 0.3 mm to 0.5 mm thicker than the thickness of the air permeable sheet 60.

A frame-shaped groove 66 is provided between the air permeable sheet 60 and the seal frame member 62. In addition, a plurality of through holes 68 are opened in the flexible plate 52, one end of the through hole 68 communicates with the groove 66, and the other end thereof is connected to an intake air source (for example, vacuum pump) via a suction pipe line which is not illustrated.

Accordingly, when the intake air source is driven, the air in the suction pipe line, the through hole 68 and the groove 66 is sucked, and thus the inner surface of the reinforcing plate 3B of the laminate 6 is vacuum-adsorbed and held on the air permeable sheet 60. In addition, since the outer peripheral surface of the reinforcing plate 3B abuts on the sealing frame member 62 in a pressed state, the sealing performance of the adsorption space surrounded by the seal frame member 62 is enhanced.

The flexible plate 52 has higher flexural rigidity than the flexible plate 58, the air permeable sheet 60 and the seal frame member 62, and thus the flexural rigidity of the flexible plate 52 governs the flexural rigidity of the peeling unit 42. The flexural rigidity per unit width (1 mm) of the peeling unit 42 is preferably 1000 to 40000 N·mm²/mm. For example, in a portion where the width of the peeling unit 42 is 100 mm, the flexural rigidity is 100000 to 4000000 N·mm². When the flexural rigidity of the peeling unit 42 is 1000 N·mm²/mm or more, bending of the reinforcing plate 3B adsorbed and held by the peeling unit 42 can be suppressed. In addition, when the flexural rigidity of the peeling unit 42 is 40000 N·mm²/mm or less, the reinforcing plate 3B adsorbed and held by the peeling unit 42 can be appropriately curved and deformed.

The flexible plates 52 and 58 are resin members and, for example, are resin members such as polycarbonate resin, polyvinyl chloride (PVC) resin, acrylic resin, polyacetal (POM) resin or the like.

[Movable Device]

On the lower surface of the flexible plate 52, a plurality of disk-like movable bodies 44 illustrated in FIG. 14 are fixed in a grid pattern as in FIG. 15. These movable bodies 44 are fixed to the flexible plate 52 by fastening members such as bolts, but they may be adhesion-fixed instead of the bolts. These movable bodies 44 are independently moved up and down by a drive device 48 which is driven and controlled by a controller 50.

Figure 17:
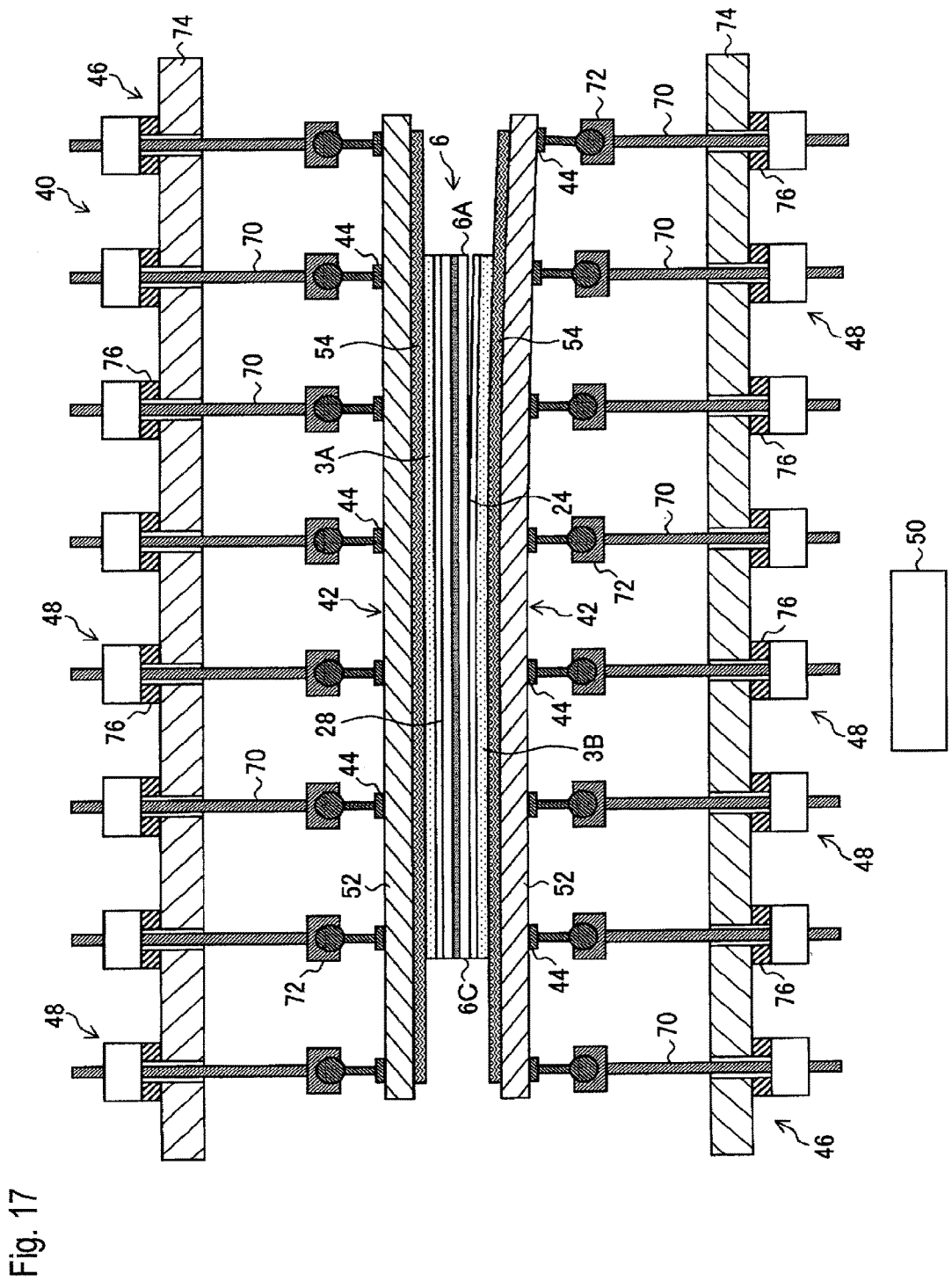
FIG. 17 is a longitudinal sectional view of a peeling device that peels an interface of a laminate.

That is, the controller 50 controls the drive device 48 to sequentially move down from the movable body 44 positioned on the side of the corner cut portion 6A of the laminate 6 in FIG. 15 to the movable body 44 positioned on the side of the corner cut portion 6C in the peeling advancing direction indicated by an arrow U. Due to this operation, the interface 24 of the laminate 6 is peeled from the peeling starting portion 26 (refer to FIG. 4) as a starting point as in the longitudinal sectional view in FIG. 17. The laminate 6 as illustrated in FIGS. 14 and 17 is the laminate 6 in which the peeling starting portions 26 and 30 are prepared by the peeling starting portion preparing method described in (A) to (C) of FIG. 3.

The drive device 48 is configured to include, for example, a rotary servomotor and a ball screw mechanism. A rotational motion of the servomotor is converted into a linear motion in the ball screw mechanism and transmitted to a rod 70 of the ball screw mechanism. The movable body 44 is disposed at the tip end portion of the rod 70 via a ball joint 72. In this manner, it is possible to tilt the movable body 44 following the curving deformation of the peeling unit 42 as in FIG. 17. Accordingly, it is possible to curve and deform the peeling unit 42 from the corner cut portion 6A toward the corner cut portion 6C without applying an excessive force to the peeling unit 42. The drive device 48 is not limited to a rotary servomotor and a ball screw mechanism, but may be a linear type servomotor or a fluid pressure cylinder (for example, pneumatic cylinder).

It is preferable that the plurality of drive devices 48 are attached to a frame 74 that can move up and down via a cushion member 76. The cushion member 76 elastically deforms so as to follow the curving deformation of the peeling unit 42. In this manner, the rod 70 is tilted with respect to the frame 74.

When the peeled reinforcing plate 3B is removed from the peeling unit 42, the frame 74 is moved down by a drive unit which is not illustrated.

The controller 50 is configured as a computer including a recording medium such as a CPU (central processing unit), an ROM (read only memory) and an RAM (random access memory). The controller 50 causes the CPU to execute the program recorded on the recording medium, and thus controls the plurality of drive devices 48 for each of the driving devices 48 to control the ascending and descending movement of the plurality of movable bodies 44.

Figure 18:
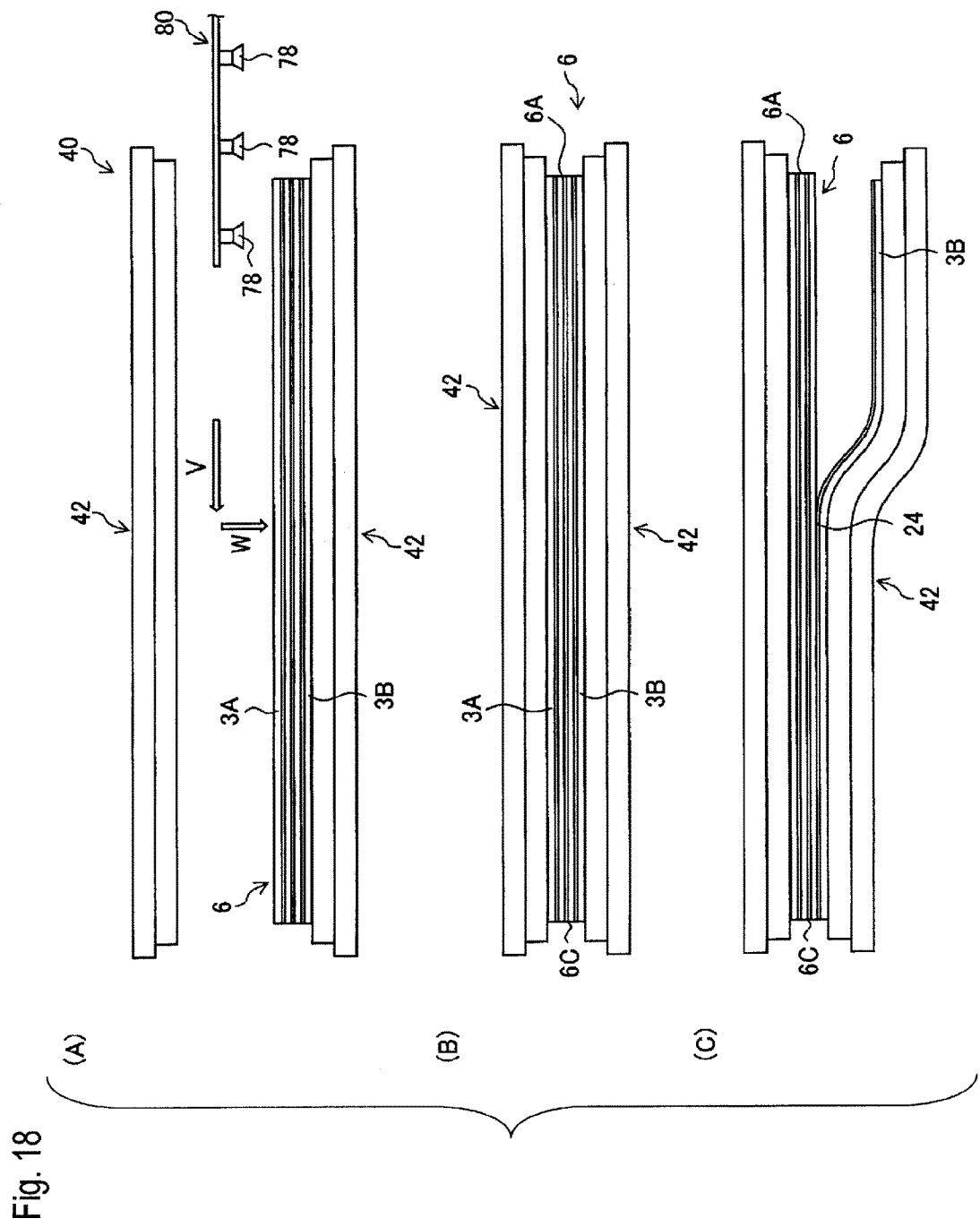
FIG. 18 (A) to (C) of FIG. 18 are explanatory diagrams sequentially illustrating a peeling method of peeling a reinforcing plate of a laminate in which a peeling starting portion is prepared by a peeling starting portion preparing method.
Figure 19:
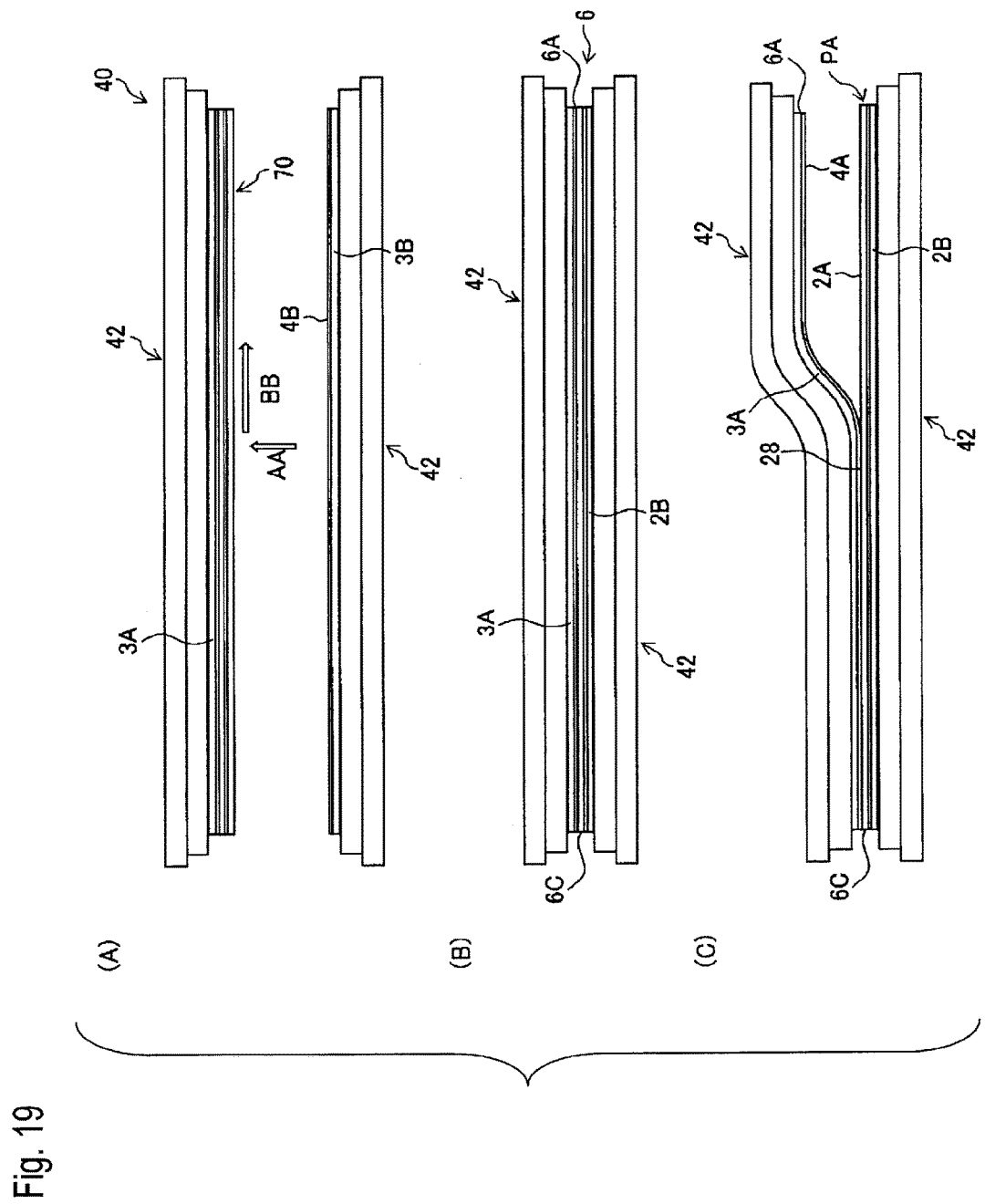
FIG. 19 (A) to (C) of FIG. 19 are explanatory diagrams sequentially illustrating the peeling method of peeling the reinforcing plate of the laminate, continuing from FIG. 18.

(A) to (C) of FIG. 18 to (A) to (C) of FIG. 19 illustrate a peeling method of the laminate 6 in which the peeling starting portions 26 and 30 are prepared in the corner cut portion 6A by the peeling starting portion preparing method explained in (A) to (C) of FIG. 3. That is, in the drawings, the peeling method of peeling the reinforcing plates 3A and 3B of the laminate 6 is sequentially illustrated.

In addition, a loading operation of the laminate 6 into the peeling device 40 and an unloading operation of the peeled reinforcing plates 3A and 3B and a panel PA are performed by a transporting device 80 having an adsorption pad 78 illustrated in (A) of FIG. 18. In FIGS. 18 and 19, the illustration of the movable device 46 is omitted in order to avoid complication of the drawing. In addition, the panel PA is a product panel in which the substrate 2A and the substrate 2B except for the reinforcing plates 3A and 3B are attached via the functional layer 7.

(A) of FIG. 18 is a side view of the peeling device 40 on which the laminate 6 is placed on the lower peeling unit 42 by the operations indicated by arrows V and W of the transporting device 80. In this case, the lower peeling unit 42 and the upper peeling unit 42 are moved in advance to positions of being relatively sufficiently retreated so that the transporting device 80 is inserted between the lower peeling unit 42 and the upper peeling unit 42. When the laminate 6 is placed on the lower peeling unit 42, the reinforcing plate 3B of the laminate 6 is vacuum-adsorbed and held by the lower peeling unit 42. That is, (A) of FIG. 18 illustrates adsorption step in which the reinforcing plate 3B is adsorbed and held by the lower peeling unit 42.

(B) of FIG. 18 is a side view of the peeling device 40 in a state where the lower peeling unit 42 and the upper peeling unit 42 are moved in a direction approaching relatively, and the reinforcing plate 3A of the laminate 6 is vacuum-adsorbed and held by the upper peeling unit 42. That is, (B) of FIG. 18 illustrates adsorption step in which the reinforcing plate 3A is adsorbed and held by the upper peeling unit 42.

In a case where the substrate 2 of the laminate 1 illustrated in FIG. 1 is peeled from the reinforcing plate 3 by the peeling device 40, the substrate 2 serving as the first substrate is supported by the upper peeling unit 42, and the reinforcing plate 3 serving as the second substrate is adsorbed and held by the lower peeling unit 42. In this case, the support portion that supports the substrate 2 is not limited to the peeling unit 42 as long as it can attachably and detachably support the substrate 2. However, since the substrate 2 and the reinforcing plate 3 can be simultaneously curved and peeled by using the peeling unit 42 as the support portion, there is an advantage that the peeling force can be reduced as compared with a mode in which only the substrate 2 or the reinforcing plate 3 is curved.

Returning to FIG. 18, (C) of FIG. 18 is a side view illustrating a state where the interface 24 of the laminate 6 is peeled from the peeling starting portion 26 (refer to FIG. 4) as a starting point, while curving and deforming the lower peeling unit 42 downward from the corner cut portion 6A toward the corner cut portion 6C of the laminate 6. That is, in the plurality of movable bodies 44 of the lower peeling unit 42 illustrated in FIG. 17, from the movable body 44 positioned on the side of the corner cut portion 6A of the laminate 6 to the movable body 44 positioned on the side of the corner cut portion 6C are sequentially moved down to peel the interface 24. In conjunction with this operation, in the plurality of movable bodies 44 of the upper peeling unit 42, from the movable body 44 positioned on the side of the corner cut portion 6A of the laminate 6 to the movable body 44 positioned on the side of the corner cut portion 6C may be sequentially moved up to peel the interface 24. In this manner, the peeling force can be reduced as compared with a mode in which only the reinforcing plate 3B is curved.

(A) of FIG. 19 is a side view of the peeling device 40 in a state where the interface 24 is completely peeled. According to the drawing, the peeled reinforcing plate 3B is vacuum-adsorbed and held by the lower peeling unit 42, and the laminate 6 (laminate configured to include reinforcing plate 3A and panel PA) except for the reinforcing plate 3B is vacuum-adsorbed and held by the upper peeling unit 42.

In addition, the lower peeling unit 42 and the upper peeling unit 42 are moved to positions of being relatively sufficiently retreated so that the transporting device 80 illustrated in (A) of FIG. 18 is inserted between the upper and lower peeling units 42.

Thereafter, first, the vacuum adsorption of the lower peeling unit 42 is released. Next, the reinforcing plate 3B is adsorbed and held by the adsorption pad 78 of the transporting device 80 via the resin layer 4B. Subsequently, the reinforcing plate 3B is unloaded from the peeling device 40 by the operation of the transporting device 80 (refer to (A) of FIG. 18) indicated by arrows AA and BB in (A) of FIG. 19.

(B) of FIG. 19 is a side view in which the laminate 6 except for the reinforcing plate 3B is vacuum-adsorbed and held by the lower peeling unit 42 and the upper peeling unit 42. That is, the lower peeling unit 42 and the upper peeling unit 42 are moved in a direction advancing relatively, and the substrate 2B is vacuum-adsorbed and held to the lower peeling unit 42.

(C) of FIG. 19 is a side view illustrating a state where the interface 28 of the laminate 6 is peeled from the peeling starting portion 30 (refer to FIG. 4) as a starting point, while curving and deforming the upper peeling unit 42 upward from the corner cut portion 6A toward the corner cut portion 6C of the laminate 6. That is, in the plurality of movable bodies 44 of the upper peeling unit 42 illustrated in FIG. 17, from the movable body 44 positioned on the side of the corner cut portion 6A of the laminate 6 to the movable body 44 positioned on the side of the corner cut portion 6C are sequentially moved up to peel the interface 28. In conjunction with this operation, in the plurality of movable bodies 44 of the lower peeling unit 42, from the movable body 44 positioned on the side of the corner cut portion 6A of the laminate 6 to the movable body 44 positioned on the side of the corner cut portion 6C may be sequentially moved down to peel the interface 28. In this manner, the peeling force can be reduced as compared with a mode in which only the reinforcing plate 3A is curved.

Thereafter, the reinforcing plate 3A completely peeled from the panel P is taken out from the upper peeling unit 42, and the panel PA is taken out from the lower peeling unit 42. The above is the peeling method of the laminate 6 in which the peeling starting portions 26 and 30 are prepared in the corner cut portion 6A.

The present application is based on a Japanese patent application No. 2014-263880 filed on Dec. 26, 2014, the contents thereof being incorporated herein by reference.

REFERENCE SIGNS LIST

1 . . . LAMINATE
1A . . . FIRST LAMINATE
1B . . . SECOND LAMINATE
2, 2A, 2B . . . SUBSTRATE (FIRST SUBSTRATE)
3, 3A, 3B . . . REINFORCING PLATE (SECOND SUBSTRATE)
4, 4A, 4B . . . RESIN LAYER (ADSORPTION LAYER)
6 . . . LAMINATE
10 . . . PEELING STARTING PORTION PREPARING DEVICE
12 . . . TABLE (LAMINATE HOLDING MEANS)
14 . . . HOLDER (KNIFE HOLDING MEANS)
18 . . . FEEDING DEVICE (MOVING MEANS)
20 . . . KNIFE
20b . . . MAIN BODY PORTION
20c . . . CUTTING EDGE PORTION
20d . . . RIDGE LINE
20e . . . THROUGH HOLE
20f . . . BURR
20g . . . CREST PORTION
20h . . . VALLEY PORTION
20k . . . PARTICLE
20m . . . RIDGE LINE PORTION
26 . . . PEELING STARTING PORTION
30 . . . PEELING STARTING PORTION
40 . . . PEELING DEVICE

The invention claimed is:

1. A method for preparing a peeling starting portion of a laminate, comprising:
inserting a knife into a laminate comprising a first substrate and a second substrate peelably attached via an adsorption layer such that the knife is inserted a predetermined amount from an end surface of the laminate into an interface between the first substrate and the adsorption layer and a peeling starting portion is prepared at the interface,
wherein the knife comprises a main body portion, a cutting edge portion continuous with the main body portion and tapered in a side view, and a ridge line which is a boundary between the main body portion and the cutting edge portion, at least a part of the adsorption layer is scraped off by a ridge line portion comprising the ridge line, and the ridge line portion has one of a shape having a plurality of through holes at positions crossing the ridge line and a shape having a corrugated ridge line having crest portions and valley portions alternately formed when viewed from the cutting edge of the knife.

2. The method according to claim 1, wherein the ridge line portion has the shape having the plurality of through holes.

3. The method according to claim 2, wherein at least one of the through holes is a through hole having a burr.

4. The method according to claim 2, wherein at least two of the through holes are through holes each having a burr, and two of the burrs have projecting directions opposite to each other.

5. The according to claim 1, wherein the ridge line portion has the shape having the corrugated ridge line.

6. The method according to claim 1, wherein the ridge line portion has particles.

7. A device for preparing a peeling starting portion, comprising:
   a knife;
   a laminate holding device that holds a laminate comprising a first substrate and a second substrate peelably attached via an adsorption layer;
   a knife holding device that holds the knife; and
   a moving device that relatively moves the laminate holding device and the knife holding device and inserts the knife into the laminate a predetermined amount from an end surface of the laminate into an interface between the first substrate and the adsorption layer,
   wherein the knife comprises a main body portion, a tapered cutting edge portion continuous with the main body portion and a ridge line which is a boundary between the main body portion and the cutting edge portion, a ridge line portion comprising the ridge line has one of a shape having a plurality of through holes at positions crossing the ridge line and a shape having a corrugated ridge line having crest portions and valley portions alternately formed when viewed from the cutting edge of the knife such that each of the shapes is configured to scrape off at least a part of the adsorption layer.

8. The device according to claim 7, wherein the ridge line portion has the shape having the plurality of through holes.

9. The device according to claim 8, wherein at least one of the through holes is a through hole having a burr.

10. The device according to claim 8, wherein at least two of the through holes are through holes each having a burr, and two of the burrs have projecting directions opposite to each other.

11. The device according to claim 7, wherein the ridge line portion has the shape having the corrugated ridge line.

12. The device according to claim 7, wherein the ridge line portion particles.

13. A method for manufacturing an electronic device, comprising:
   forming a function layer on a laminate comprising a first substrate and a second substrate peelably attached via an adsorption layer such that the functional layer is formed on a surface of the first substrate; and
   peeling the first substrate, on which the functional layer is formed, from the second substrate,
   wherein the peeling comprises inserting a knife a predetermined amount from an end surface of the laminate at an interface between the first substrate and the adsorption layer such that a peeling starting portion is prepared at the interface, and peeling the interface from the peeling starting portion as a starting point, the knife comprises a main body portion, a cutting edge portion continuous with the main body portion and tapered in a side view, and a ridge line which is a boundary between the main body portion and the cutting edge portion, at least a part of the adsorption layer is scraped off by a ridge line portion comprising the ridge line, and the ridge line portion has one of a shape having a plurality of through holes at positions crossing the ridge line and a shape having a corrugated ridge line having crest portions and valley portions alternately formed when viewed from the cutting edge of the knife.

14. The method according to claim 13, wherein the ridge line portion has the shape having the plurality of through holes.

15. The method according to claim 14, wherein at least one of the through holes is a through hole having a burr.

16. The method according to claim 14, wherein at least two of the through holes are through holes each having a burr, and two of the burrs have projecting directions opposite to each other.

17. The method according to claim 13, wherein the ridge line portion has the shape having the corrugated ridge line.

18. The method according to claim 13, wherein the ridge line portion has particles.

* * * * *